United States Patent
Smith et al.

(10) Patent No.: US 6,699,627 B2
(45) Date of Patent: Mar. 2, 2004

(54) REFERENCE WAFER AND PROCESS FOR MANUFACTURING SAME

(76) Inventors: Adlai Smith, 2920 Summit Dr., Escondido, CA (US) 92025; Bruce McArthur, 4143 Bonanza, San Diego, CA (US) 92117; Robert Hunter, Jr., 13718 Treviso Ct., San Diego, CA (US) 92130

( * ) Notice: Subject to any disclaimer, the term of this patent is extended or adjusted under 35 U.S.C. 154(b) by 143 days.

(21) Appl. No.: 10/020,569

(22) Filed: Dec. 7, 2001

(65) Prior Publication Data
US 2002/0102482 A1 Aug. 1, 2002

Related U.S. Application Data

(60) Provisional application No. 60/254,271, filed on Dec. 8, 2000, provisional application No. 60/254,413, filed on Dec. 8, 2000, and provisional application No. 60/254,315, filed on Dec. 8, 2000.

(51) Int. Cl.$^7$ .............................. G03F 9/00; G03C 5/00

(52) U.S. Cl. ......................................... 430/22; 430/30

(58) Field of Search ..................... 430/22, 30; 356/399, 356/400, 401; 355/52, 53

(56) References Cited

U.S. PATENT DOCUMENTS

| | | | |
|---|---|---|---|
| 4,757,207 A | 7/1988 | Chappelow et al. | 250/491.1 |
| 4,861,148 A | 8/1989 | Sato et al. | 350/505 |
| 4,929,083 A | 5/1990 | Brunner | 356/400 |
| 5,124,927 A | 6/1992 | Hopewell et al. | 364/468 |
| 5,262,257 A | 11/1993 | Fukuda et al. | 430/5 |
| 5,285,236 A | 2/1994 | Jain | 355/53 |
| 5,438,413 A | 8/1995 | Mazor et al. | 356/363 |
| 5,444,538 A | 8/1995 | Pellegrini | 356/401 |
| 5,477,058 A | 12/1995 | Sato | 250/548 |
| 5,700,602 A | 12/1997 | Dao et al. | 430/5 |
| 5,757,507 A | 5/1998 | Ausschnitt et al. | 356/401 |
| 5,805,290 A | 9/1998 | Ausschnitt et al. | 356/401 |
| 5,824,441 A | 10/1998 | Farrow et al. | 430/22 |
| 5,877,861 A | 3/1999 | Ausschnitt et al. | 356/401 |
| 5,953,128 A | 9/1999 | Ausschnitt et al. | 356/399 |
| 6,023,338 A | 2/2000 | Bareket | 356/401 |
| 6,064,486 A | 5/2000 | Chen et al. | 356/401 |
| 6,079,256 A | 6/2000 | Bareket | 73/105 |
| 6,130,750 A | 10/2000 | Ausschnitt et al. | 356/401 |
| 6,137,578 A | 10/2000 | Ausschnitt | 356/399 |
| 6,142,641 A | 11/2000 | Cohen et al. | 359/859 |
| 6,143,621 A | 11/2000 | Tzeng et al. | 438/401 |
| 6,153,886 A | 11/2000 | Hagiwara et al. | 250/548 |
| 6,163,366 A | 12/2000 | Okamoto et al. | 355/53 |
| 6,204,912 B1 | 3/2001 | Tsuchiya et al. | 355/53 |
| 6,218,200 B1 | 4/2001 | Chen et al. | 438/14 |
| 6,417,929 B1 | 7/2002 | Ausschnitt et al. | 356/635 |

OTHER PUBLICATIONS

Armitage et al., "Analysis of Overlay Distortion Patterns", *SPIE*, 921:207–222 (1988).
Biesterbos et al., "A New Lens for Submicron Lithography and its Consequences for Wafer Stepper Design", *SPIE*, 633:34–43 (1986).
Bjorkholm et al., "Reduction Imaging at 14 nm Using Multilayer–Coated Optics: Printing of Features Smaller than 0.1 $\mu m$", *J. Vac. Sci. Technol. B.*, 8(6):1509–1543 (1990).
Bruning et al., "Optical Lithography—Thirty Years and Three Orders of Magnitude", *SPIE*, 3051:14–27 (1997).
Brunner, T.A., "Impact of Lens Aberrations on Optical Lithography", *IBM Journal of Research and Development: Optical Lithography*, 41(1–2):57–67 (1997).
Cote et al., "Micrascan™ III–Performance of a Third Generation, Catadioptric Step and Scan Lithographic Tool", *SPIE*, 3051:806–816 (1997).
DeJule, R., "Mix and Match: A Necessary Choice", *Semiconductor International*, 23(2):66–76 (2000).
Dooly et al., "Stepper Matching for Optimum Line Performance", *SPIE*, 3051:426–432 (1997).
Goodwin et al., "Characterizing Overlay Registration of Concentric 5X and 1X Stepper Exposure Fields Using Interfield Data", *SPIE*, 3050:407–417 (1997).
Goodwin, F., "Expanding Capabilities in Existing Fabs with Lithography Tool–Matching", *Solid State Technology*, pp. 97–106 (2000).
*Handbook of Microlithography, Micromachining and Microfabrication*, Book: vol. 1, "Microlithography", Rai–Choudhury, P. (Ed.), SPIE Optical Engineering Press, SPIE, Bellingham, Washington, pp. 417–418 (1997).
Hasan et al., "Automated Electrical Measurements of Registration Errors in Step–and–Repeat Optical Lithography Systems", *IEEE Transactions on Electron Devices*, ED27(12):2304–2312 (1980).
Kenp et al., "A 'Golden Standard' Wafer Design for Optical Stepper Characterization", *SPIE*, 1464:260–266 (1991).

(List continued on next page.)

*Primary Examiner*—Christopher G. Young

(57) ABSTRACT

An apparatus and method for manufacturing and using a calibrated registration reference wafer in a semiconductor manufacturing facility. A reference reticle consisting of a 2-dimensional array of standard alignment attributes is exposed several times onto a photoresist coated semiconductor wafer using a photolithographic exposure tool. After the final steps of the lithographic development process the resist patterned wafer is physically etched using standard techniques to create a permanent record of the alignment attribute exposure pattern. The permanently recorded alignment attributes are measured for placement error using a conventional overlay metrology tool. The resulting overlay error data is used to generate a calibration file that contains the positions of the alignment attributes on the reference wafer. The reference wafer and calibration file can be used to determine the wafer stage registration performance for any photolithographic exposure tool.

27 Claims, 19 Drawing Sheets

OTHER PUBLICATIONS

KLA 5105, "Linewidth and Misregistration System", KLA 5105 Product Specification, *KLA Instruments Corporation*, 2 pages (1995).

KLA 5200, "Value–added Overlay Metrology for Advanced Lithography", KLA 5200 Product Specifications, *KLA Instruments Corporation*, 2 pages, (1996).

Kodama et al., "Measuring System XY–5i", *SPIE, 2439*:144–155 (1995).

Leica LMS IPRO, "Fully Automated Mask and Wafer Metrology System", *Leica*, pamphlet pp. 1–5.

Lin, B.J., "The Attenuated Phase–Shifting Mask", *Solid State Technology*, Special Series/Advanced Lithography, 35(1):43–47 (1992).

MacMillen et al., "Analysis of Image Field Placement Deviations of a 5X Microlithographic Reduction Lens", *SPIE, 334*:78–89 (1982).

Martin et al., "Measuring Fab Overlay Programs", *SPIE, 3677*:64–71 (1999).

McFadden et al., "A Computer Aided Engineering Workstation for Registration Control", *SPIE, 1087*:255–266 (1989).

Mulkens et al., ArF Step and Scan Exposure System for 0.15 μm Technology Node?, *SPIE, 3679*:506–521 (1999).

Müller et al., "Large Area Fine Line Patterning by Scanning Projection Lithography", *MCM Proceedings*, pp. 100–104 (1994).

Newman et al., "Development of XUV Projection Lithograph at 60–80 nm", *SPIE, 1671*:419–436 (1992).

Nikon Lithography Tool Brochures (Japanese Nikon).

*Numerical Recipes*, "The Art of Scientific Computing", Press et al., (Eds.), Cambridge University Press, New York, pp. 52–64 (1990).

Pellegrini, J.C., "Comparisons of Six Different Intrafield Control Paradigms in an Advanced Mix–and–Match Environment", *SPIE, 3050*:398–406 (1997).

Pellegrini et al., "Super Sparse Overlay Sampling Plans: An Evaluation of Methods and Algorithms for Optimizing Overlay Quality Control and Metrology Tool Throughput", *SPIE, 3677*:72–82 (1999).

Preil et al., "A New Approach to Correlating Overlay and Yield", *SPIE, 3677*:208–216 (1999).

Progler et al., "Method to Budget and Optimize Total Device Overlay", *SPIE, 3679*:193–207 (1999).

Quaestor Q7, "Fully Automated Optical Metrology System for Advanced IC Production", Quaestor Q7 Product Specification, *BIO–RAD*, 2 pages.

Raugh, M.R., "Error Estimation for Lattice Methods of State Self–Calibration", *SPIE, 3050*:614–625 (1997).

Starikov et al., "Accuracy of Overlay Measurements: Tool and Mark Asymmetry Effects", *Optical Engineering, 31*(6):1298–1310 (1992).

Sullivan, N.T., "Semiconductor Pattern Overlay", *SPIE Critical Reviews of Optical Science and Technology, CR52*:160–188 (1994).

Takac et al., "Self–Calibration in Two–Dimensions: The Experiment", *SPIE, 2725*:130–146 (1996).

van den Brink et al., "Direct–Referencing Automatic Two–Points Reticle–to–Wafer Alignment Using a Projection Column Servo System", *SPIE, 633*:60–71 (1986).

van den Brink et al., "Matching Management of Multiple Wafer Steppers Using a Stable Standard and a Matching Simulator", *SPIE, 1087*:218–232 (1989).

van den Brink et al., "Matching of Multiple Wafer Steppers for 0.35 μm Lithography Using Advanced Optimization Schemes", *SPIE, 1926*:188–207 (1993).

van den Brink et al., "Matching Performance for Multiple Wafer Steppers Using an Advanced Metrology Procedure", *SPIE, 921*:180–197 (1988).

van den Brink et al., "New 0.54 Aperture i–Line Wafer Stepper with Field by Field Leveling Combined with Global Alignment", *SPIE, 1463*:709–724 (1991).

van den Brink et al., "Step–and–Scan and Step–and–Repeat, A Technology Comparison", *SPIE, 2726*:734–753 (1996).

van Schoot et al., "0.7 NA DUV Step & Scan System for 150nm Imaging with Improved Overlay", *SPIE, 3679*:448–463 (1999).

Yost et al., "Lens Matching and Distortion Testing in a Multi–Stepper, Sub–Micron Environment", *SPIE, 1087*:233–244 (1989).

Zavecz et al., "Life Beyond Mix–and–Match: Controlling Sub–0.18 μm Overlay Errors", *Semiconductor International, 23*(8):205,206,208,210,212 and 214 (2000).

Zavecz, T.E., "Machine Models and Registration", *SPIE Critical Reviews of Optical Science and Technology, CR52*:134–159 (1994).

Zych et al., "Electrical Methods for Precision Stepper Column Optimization", *SPIE, 633*:98–105 (1986).

Reticle Alignment
2702 Outer Box Structure

Developed Golden Wafer 2902

Outer Box Reticle Printed at 9 Locations

Field (9x)

Photoresist
Developed Outer
Etched Inner Box From Reference Stepper or Scanner

| Feature | xG | yG | dx | dy |
|---------|-----------|-----------|-----------|-----------|
| M1 | -95.000000 | 0.000000 | 0.000050 | -0.000037 |
| M2 | 0.000000 | -95.000000 | -0.000387 | 0.000298 |
| M3 | 95.000000 | 0.000000 | 0.000499 | -0.000799 |
| M4 | 0.000000 | 95.000000 | 0.000174 | 0.000274 |
| RM | 10.000000 | 10.000000 | 0.000598 | 0.000420 |
| RM | 10.000000 | 20.000000 | 0.000495 | -0.000229 |
| ⋮ | ⋮ | ⋮ | ⋮ | ⋮ |
| RM | -60.000000 | -80.000000 | 0.000339 | 0.000449 |

52 Entries For Wafer of Figure 33

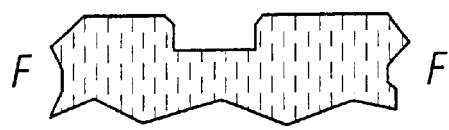
Pits in Wafer
FIG. 35A
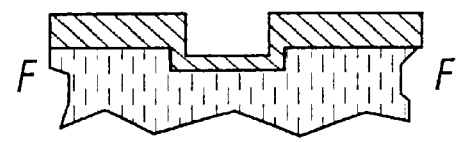
Pits in Wafer Overcoated
FIG. 35D
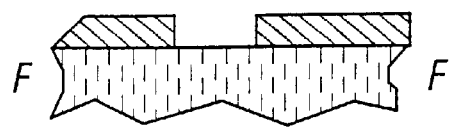
Pits in Overcoating
FIG. 35B
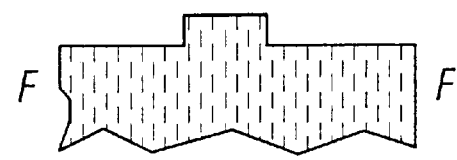
Mound in Wafer
FIG. 35E
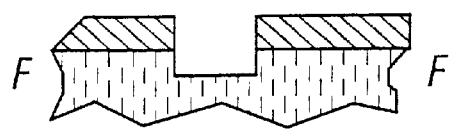
Pits in Overcoating & Wafer
FIG. 35C
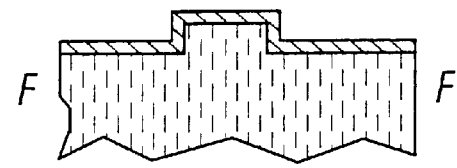
Overcoated Mound on Wafer
FIG. 35F
 = Si or Substrate
 = Deposited of Overcoat Layer

REFERENCE WAFER AND PROCESS FOR MANUFACTURING SAME

REFERENCE TO PRIORITY DOCUMENT

This application claims priority to pending U.S. provisional application serial No. 60/254,271 filed Dec. 8, 2000, and U.S. patent application Ser. No. 09/835,201 filed Apr. 13, 2001, both applications entitled "Method And Apparatus For Self-Referenced Projection Lens Distortion Mapping", by Adlai Smith, Bruce McArthur, and Robert Hunter; U.S. provisional application serial No. 60/254,413 filed Dec. 8, 2000 and U.S. patent application Ser. No. 09/891,699 filed Jun. 26, 2001, both applications entitled "Method And Apparatus For Self-Referenced Wafer Stage Positional Error Mapping", to Adlai Smith, Bruce McArthur, and Robert Hunter; and U.S. provisional application serial No. 60/254,315 filed Dec. 8, 2000 entitled "Reference Wafer and Process for Manufacturing Same", to Adlai Smith, Bruce McArthur, and Robert Hunter, all of which are incorporated by reference in their entirety herein.

BACKGROUND OF THE INVENTION

1. Field of the Invention

The present invention relates generally to processes for semiconductor manufacture and more particularly to semiconductor pattern overlay.

2. Description of Related Art

Lithographic processing is increasingly requiring ever tighter layer-to-layer overlay tolerances to meet device performance requirements. Overlay registration on critical layers can directly impact device performance, yield and repeatability. Increasing device densities, decreasing device feature sizes and greater overall device size conspire to make pattern overlay one of the most important performance issues during the semiconductor manufacturing process. The ability to accurately determine correctable and uncorrectable pattern placement error depends on fundamental techniques and algorithms used to calculate lens distortion, stage error, and reticle error.

Overlay registration generally refers to translational error that exists between features exposed layer to layer in a vertical fabrication process of semiconductor devices on silicon wafers. Other names for overlay registration include, registration error and pattern placement error. A typical microelectronic device or circuit may consist of 20–30 levels or pattern layers. The placement of patterned features on other levels must match the placement of corresponding features on other levels, commonly referred to as overlap, within an accuracy which is some fraction of the minimum feature size or critical dimension (CD).

Overlay error is typically, although not exclusively, measured with an optical overlay metrology tool. See Semiconductor Pattern Overlay, N. Sullivan, SPIE Vol. 3051, 426:432, 1997; Accuracy of Overlay Measurements: Tool and Mark Asymmetry Effects, A. Starikov et al., Optical Engineering, 1298:1309, 1992; KLA 5105 Overlay Brochure, KLA-Tencor; KLA 5200 Overlay Brochure, KLA Tencor; Quaestor Q7 Brochures, Bio-rad Semiconductor Systems. Lithographers have crafted a variety of analysis techniques that attempt to separate out systematic process induced overlay error from random process induced error using a variety of statistical methods. See A Computer Aided Engineering Workstation for Registration Control, E. McFadden, C. Ausschnitt, SPIE Vol. 1087, 255:266, 1989; A "Golden Standard" Wafer Design for Optical Stepper Characterization, K. Kenp, C. King, W. W, C. Stager, SPIE Vol. 1464, 260:266, 1991; Matching Performance for Multiple Wafer Steppers using an Advanced Metrology Procedure, M. Van den Brink et al., SPIE Vol. 921, 180:197, 1988; Characterizing Overlay Registration of Concentric 5× and 1× Stepper Exposure Fields Using Interfield Data, F. Goodwin, J. Pellegrini, SPIE Vol. 3050, 407:417, 1997; Super Sparse Overlay Sampling Plans: An Evaluation of Methods and Algorithms for Optimizing Overlay Quality Control and Metrology Tool Throughput, J. Pellegrini, SPIE Vol. 3677, 72:82, 36220.

The importance of overlay error and its impact to yield can be found elsewhere. See Measuring Fab Overlay Programs, R. Martin, X. Chen, I. Goldberger, SPIE Conference on Metrology, Inspection, and Process Control for Microlithography XIII, 64:71, March 1999; A New Approach to Correlating Overlay and Yield, M. Preil, J. McCormack, SPIE Conference on Metrology, Inspection, and Process Control for Microlithography XIII, 208:216, March 1999. Lithographers have created statistical computer algorithms (for example, Klass II (See Lens Matching and Distortion Testing in a Multi-Stepper, Sub-Micron Environment, A. Yost et al., SPIE Vol. 1087, 233:244, 1989) and Monolith (See A Computer Aided Engineering Workstation for Registration Control, supra)) that attempt to separate out correctable sources of pattern placement error from non-correctable sources of error. See Analysis of overlay distortion patterns, J. Armitage, J. Kirk, SPIE Vol. 921, 207:221, 1988; Method to Budget and Optimize Total Device Overlay, C. Progler et al., SPIE Vol. 3679, 193:207, 1999; and System and Method for Optimizing the Grid and Intrafield Registration of Wafer Patterns, J. Pellegrini, U.S. Pat. No. 5,444,538 issued Aug. 22, 1995. Overall theoretical reviews of overlay modeling can be found in See Semiconductor Pattern Overlay, supra; Machine Models and Registration, T. Zavecz, SPIE Critical Reviews Vol. CR52, 134:159.

Typically, most overlay measurements are made on silicon product wafers after each lithographic process, prior to final etch. Product wafers cannot be etched until the alignment attributes or overlay target patterns are properly aligned to the underlying overlay target patterns. Examples of overlay targets are described in Overlay Alignment Measurement of Wafers, N. Bareket, U.S. Pat. No. 6,079,256 issued Jun. 27, 2000 (at FIG. 1b), Matching Management of Multiple Wafer Steppers Using a Stable standard and a Matching Simulator, M. Van den Brink et al., SPIE Vol. 1087, 218:232, 1989; Automated Electrical Measurements of Registration Errors in Step and Repeat Optical Lithography Systems, T. Hasan et al., IEEE Transactions on Electron Devices, Vol. ED-27, No. 12, 2304:2312, December 1980; Method of Measuring Bias and Edge Overlay Error for Sub 0.5 Micron Ground Rules, C. Ausschnitt et al., U.S. Pat. No. 5,757,507 issued May 26, 1998; Capacitor Circuit Structure for Determining Overlay Error, K. Tzeng et al., U.S. Pat. No. 6,143,621 issued Nov. 7, 2000.

Generally, manufacturing facilities rely heavily on exposure tool alignment, wafer stage matching and calibration procedures (See Stepper Matching for Optimum Line Performance, T. Dooly, Y. Yang, SPIE Vol. 3051, 426:432, 1997; Matching Management of Multiple Wafer Steppers Using a Stable standard and a Matching Simulator, supra), Matching Performance for Multiple Wafer Steppers using and Advanced Metrology Procedure, supra) to help insure that the stepper or scanner tools are aligning properly; inaccurate overlay modeling algorithms can corrupt the exposure tool calibration procedures and degrade the alignment accuracy of the exposure tool system. See Characterizing Overlay Registration of Concentric 5× and 1× Stepper Exposure Fields Using Interfield Data, supra.

Over the past 30 years the microelectronics industry has experienced dramatic, and rapid decreases in critical dimension in part due to improving lithographic imaging systems. See A New Lens for Submicron Lithography and its Consequences for Wafer Stepper Design, J. Biesterbos et al., SPIE Vol. 633, Optical Microlithography V, 34:43, 1986; New 0.54 Aperture I-Line Wafer Stepper with Field by Field Leveling Combined with Global Alignment, M. Van den Brink, B. Katz, S. Wittekoek, SPIE Vol. 1463, 709:724; Step and Scan and Step and Repeat, a Technology Comparison, M. Van den Brink et al., SPIE Vol. 2726, 734:753; 0.7 NA DUV Step and Scan System for 150 nm Imaging with Improved Overlay, J. V. School, SPIE Vol. 3679, 448:463, 1999. Today, these photolithographic exposure tools or machines are pushed to their performance limits. As the critical dimensions of semiconductor devices approach 50 nm the overlay error requirements will soon approach atomic dimensions. See Life Beyond Mix-and-Match: Controlling Sub-0.18 Micron Overlay Errors, T. Zavecz, Semiconductor International, July 2000. To meet the needs of next generation device specifications new overlay methodologies need to be developed. In particular, overlay methodologies that can accurately separate out systematic and random effects and break them into assignable causes may greatly improve device process yields. See A New Approach to Correlating Overlay and Yield, supra; Expanding Capabilities in Existing Fabs with Lithography Tool-Matching, F. Goodwin et al., Solid State Technology, 97:106, June 2000; Super Sparse Overlay Sampling Plans: An Evaluation of Methods and Algorithms for Optimizing Overlay Quality Control and Metrology Tool Throughput, supra; Lens Matching and Distortion Testing in a Multi-Stepper, Sub-Micron Environment, supra.

New "mix and match" technologies that can quickly and accurately reduce the registration error through better calibration and cross referencing procedures are desirable. See Mix-and-Match: A Necessary Choice, R. DeJule, Semiconductor International, 66:76, February 2000.

SUMMARY OF THE INVENTION

In accordance with the invention, a process for manufacturing, using, and maintaining a calibrated registration reference wafer for use in semiconductor manufacturing facilities is described. A reference reticle consisting of, for example, a 2-dimensional array of standard alignment attributes is exposed in an interlocking field pattern onto a photoresist coated semiconductor wafer using a photolithographic exposure tool. Following the lithographic development process, the resist patterned wafer is physically etched using standard techniques, thereby creating a permanent record of the alignment attribute exposure pattern. Along the interlocking rows and columns of the resulting wafer, the permanently recorded alignment attributes are measured for placement error using a conventional overlay metrology tool. The resulting overlay error data may be used, for example, in a software program, to generate a unique reference wafer calibration file that contains the positions of all the reference marks (alignment attributes) forming an uninterrupted, regular array across the wafer as well as the wafer alignment marks. The positions of these alignment attributes on the reference wafer can be determined very accurately, except for the possibility of arbitrary translation, rotation, asymmetric scaling and non-orthogonal positional offset errors.

The reference wafer and its associated calibration file can be used to determine the wafer stage registration performance for any photolithographic exposure tool. The accuracy and the precision of the calculated registration error are controlled, in large part, by the number of alignment attributes and overlay measurements. In addition, the process can be quickly repeated resulting in multiple reference wafers. Because of the ease of manufacture of this article, each photolithographic exposure tool in a semiconductor factory can have its own unique reference wafer for routine monitoring. Furthermore, the method of calculating the positional coordinates of the alignment attributes for the preferred reference wafer are more accurate and precise as compared to other techniques. The reference wafer, and its associated calibration file, may then be used as a calibrated ruler for measuring registration error induced by any photolithographic exposure tool, independently from a reference machine. Because a conventional overlay metrology tool is used for local measurements to extract global wafer stage and lens distortion, the above described process can be easily implemented in a semiconductor fabrication facility. Additional applications of the resulting calibrated reference wafers include; improved lithographic simulation using conventional optical modeling software, advanced process control in the form of feedback loops that automatically adjust the projection lens, reticle stage, and wafer stage for optimum registration performance.

The reference wafer, or archive wafer, and its associated calibration file functions as a "ruler" and it can be used like a traditional "golden wafer" in the sense that an exposure of the reference marks 3302 illustrated in FIG. 33, by any lithographic projection tool. For example, a set of complementary marks like the outer box 2702, illustrated in FIGS. 27 and 28 or the outer box 1302 and inner box 1304 marks illustrated in FIGS. 13A and 13B, result in a box-in-box structure or complete alignment attribute that can be measured with a conventional overlay metrology tool. Using the measurements from the overlay metrology tool and subtracting the corrections provided by the reference wafer calibration file from the overlay measurements, the combination of the intra-field and the inter-field errors of a machine can be directly interpreted. By accounting for stage distortion and yaw effects during the determination of the calibration, the inherent machine-to-machine reference errors of the prior art golden wafer method are effectively eliminated. See A "Golden Standard" Wafer Design for Optical Stepper Characterization, supra; Matching Management of Multiple Wafer Steppers Using a Stable standard and a Matching Simulator, supra.

Improvement in the measurement accuracy reduces the need for cross calibration between different photolithographic exposure tool sets and allows direct interpretation, after calibration file correction, of the results of a set of overlay measurements using the reference wafer. Errors in the overlay measurements due to the exposure of the present machine and not as due to systematic or random errors associated with the machine on which the reference wafer was manufactured. The technique described above can adjust the accuracy by adjusting the number of alignment attributes or overlay measurements.

A technique in accordance with the present invention includes providing a reticle, exposing a reference wafer in such a way as to create a unique pattern of overlapped interlocking alignment attributes, etching the reference wafer, measuring the interlocked alignment attributes, and finally creating a reference wafer calibration file that permanently records the positional coordinates of the alignment attributes. Additionally, other embodiments may allow production of a robust set of reference wafers for manufacturing facilities that use scanners in addition to steppers. For this case, we minimize the non-repeatable source of intra-field error associated with the moving scanner stage during the exposure of the reference wafer by using a special reticle and multiple exposures. By utilizing a high precision overlay metrology tool for local measurements and extracting a global set of calibrated positional measurement, the metrology error multiplier can be kept near unity.

FIG. 6 is a flow chart illustrating an embodiment for creating a reference wafer. In block 602, a reference reticle, for example the reticle illustrated in FIGS. 13A, 13B, 13C, 14 containing an array of alignment attributes 1302, 1304, 1306 and wafer alignment marks 1308, is loaded into an exposure tools' reticle management system 1002, as illustrated in FIG. 10, and aligned. Wafers possibly laser or otherwise scribed with unique wafer identification codes and possibly coated with various thin films are provided. Examples of such thin films on silicon wafers are silicon nitride, silicon dioxide, amorphous silicon, or polysilicon.

Flow continues to block 604 where the wafer is then coated with photoresist and loaded into a projection imaging tool or machine and exposed, in block 606, in an overlapping interlocking pattern. Examples of overlapping interlocking patterns are illustrated in FIGS. 12 and 16A. The projection imaging tool may include contact or proximity printers, steppers, scanners, direct write, e-beam, x-ray, SCALPEL, IPL, or EUV machines. See Direct-Referencing Automatic Two-Points Reticle-to-Wafer Alignment Using a Projection Column Servo System, M. Van den Brink, H. Linders, S. Wittekoek, SPIE Vol. 633, Optical Microlithography V, 60:71, 1986; New 0.54 Aperture I-Line Wafer Stepper with Field by Field Leveling Combined with Global Alignment, supra; Refs 4861146, Micrascan™ III Performance of a Third Generation, Catadioptric Step and Scan Lithographic Tool, D. Cote et al., SPIE Vol. 3051, 806:816, 1997; Step and Scan Exposure System for 0.15 Micron and 0.13 Micron Technology Node, J. Mulkens et al., SPIE Conference on Optical Microlithography XII, 506:521, March 1999; 0.7 NA DUV Step and Scan System for 150 nm Imaging with Improved Overlay, supra; Optical Lithography—Thirty Years and Three Orders of Magnitude, J. Bruning, SPIE Vol. 3051, 14:27, 1997; Large Area Fine Line Patterning by Scanning Projection Lithography, H. Muller et al., MCM 1994 Proceedings, 100:104; Large-Area, High-Throughput, High-Resolution Projection Imaging System, K. Jain, U.S. Pat. No. 5,285,236 issued Feb. 8, 1994; Development of XUV Projection Lithography at 60–80 nm, B. Newnam et al., SPIE Vol. 1671, 419:436, 1992; Mix-and-Match: A Necessary Choice, supra. In the examples illustrated in FIGS. 12 and 16A, each exposure field is separated from the previous exposure by a desired distance such that neighboring fields have their corresponding interlocking rows or columns overlapped. See Mix-and-Match: A Necessary Choice, supra. This partially overlapping exposure technique is shown in FIGS. 12 and 16A. Following the exposures of the interlocking array, the wafer alignment marks and their corresponding interlocking rows and columns are exposed as separate fields but interlock into the previous exposure set.

Flow then continues to block 608 where, after the final exposure the wafer is removed from the machine and sent through the final few resist development steps. Next, the wafers are etched and stripped of photoresist and possibly overcoated with another layer. This leaves the alignment attributes and wafer alignment marks permanently recorded on the wafer surfaces. Flow then continues to block 610 where the resulting alignment attributes along the interlocking rows and columns are measured for registration, placement or overlay error using an overlay metrology tool such as a KLA-Tencor model 5200. See KLA 5200 Overlay Brochure, supra; KLA 5105 Overlay Brochure, supra; Quaestor Q7 Brochures, supra; Process for Measuring Overlay Misregistration During Semiconductor Wafer Fabrication, I. Mazor et al., U.S. Pat. No. 5,438,413 issued Aug. 1, 1995; Overlay Alignment Measurement of Wafers, supra. FIG. 9 is a schematic illustrating common causes of overlay or placement error for inter-field and intra-field.

Next, in block 612, the intra-field distortion of the projection imaging tool used to create the reference wafer is provided. Flow continues to block 614 when the resulting data set is entered into a computer algorithm where a special calibration file containing the positional coordinates for each alignment attribute is constructed for the reference wafer. The final articles as created by the present invention consist of a reference wafer containing reference marks on a periodic array interrupted only by wafer alignment marks as illustrated in FIG. 33, and a unique calibration file that lists the location of each reference and wafer alignment mark on the wafer as illustrated in FIG. 34. The process described above can be repeated multiple times resulting in numerous individual reference wafers. Once a calibration file is on record and the positions of each alignment attribute is known, the wafer can be used as a two dimensional (2-D) rigid ruler to measure the registration error associated with a given projection imaging tool—similar to the prior art golden wafer techniques. See A "Golden Standard" Wafer Design for Optical Stepper Characterization, supra. However, the preferred embodiment allows for the direct measurement of the overlay error unique to the machine being tested—without reference to another machine either directly or indirectly.

BRIEF DESCRIPTION OF THE DRAWINGS

The features of this invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction the accompanying drawings in which:

FIGS. 35A–35F are cross sectional views of a reference wafer.

DETAILED DESCRIPTION

Figure 11A:
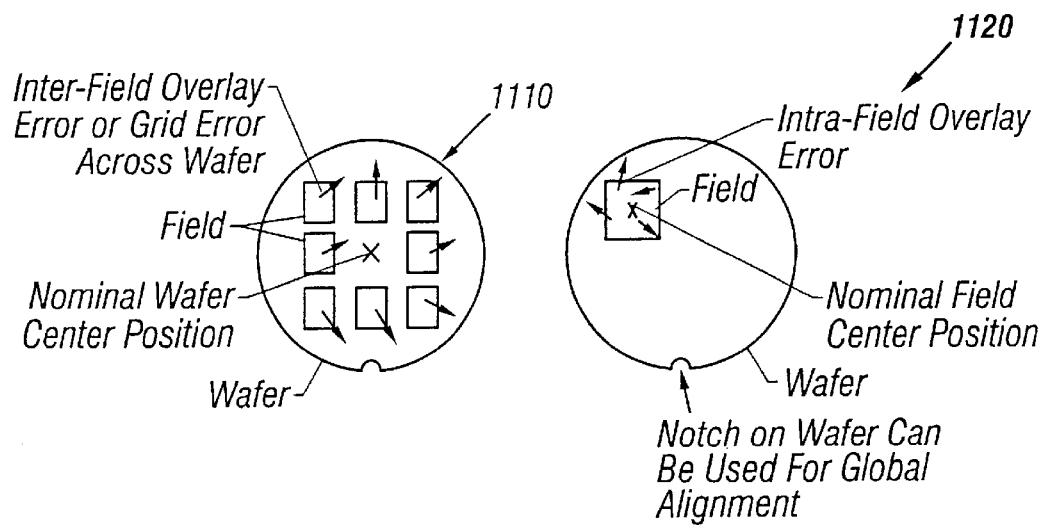
FIG. 11A is a schematic showing inter-field and intra-field overlay error.
Figure 11B:
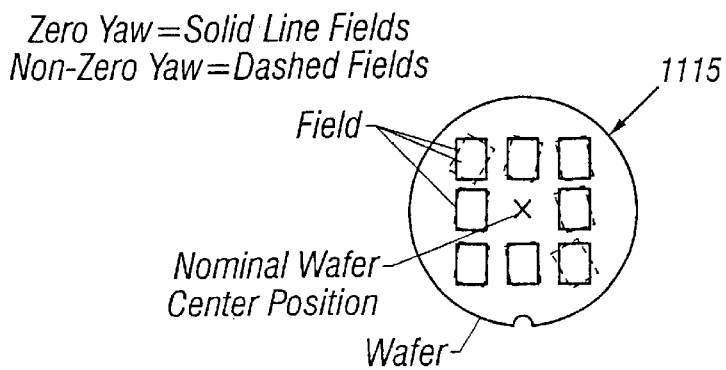
FIG. 11B is a schematic showing inter-field yaw error.

The effects of overlay error are typically divided into two major categories for the purpose of quantifying overlay error and making precise exposure adjustments to correct the problem. The first category, referred to as grid or inter-field error, is the positional shift and rotation 1110 as illustrated in FIG. 11A, or yaw 1115 as illustrated in FIG. 11B, of each exposure pattern, exposure field, or simple field, with reference to the nominal center position of the wafer. These global or inter-field positional errors may be caused by the wafer stage subsystem of the photolithographic exposure tool. Overlay modeling algorithms typically divide grid or inter-field error into various sub-categories or components the most common of which are translation, rotation, magnification or scale, non-orthogonality, stage distortion and stage rotation. See Matching Performance for Multiple Wafer Steppers using and Advanced Metrology Procedure, supra.

The second category, intra-field overlay error is the positional offset of an individual point inside an exposure field referenced to the nominal center of an individual exposure field 1120 in FIG. 11A. Generally, the term "nominal center" means the location of the center of a perfectly aligned exposure field; operationally this is the (x,y) position where the lithographic projection is commanded to print the exposure field (field). The following four components, each named for a particular effect, are typically used to describe the sources of intra-field error: translation, rotation, scale or magnification and lens distortion. Intra-field overlay errors are typically related to lens aberrations, reticle alignment, and dynamic stage errors for scanners. Separation of the overlay error into inter-field and intra-field components is based on the physically distinguishable sources of these errors, lens aberrations, dynamic stage errors, or reticle positioning for intra-field and the wafer stage for inter-field.

A process of creating and maintaining calibrated registration reference wafers that can be used to measure and determine the registration error associated with wafer stages and lenses of projection tools is described. The placement of patterned features on subsequent levels must match the placement of corresponding features on previous levels, i.e. overlap, within an accuracy which is typically some fraction of a minimum feature size or critical dimension (CD). Overlay registration is the localized translational error that exists between features exposed layer to layer in the vertical manufacturing process of semiconductor devices on silicon wafers. Overlay registration is also referred to as registration error or pattern placement error.

Figure 21:
FIG. 21 is a schematic showing overlay measurement notation.

Inter-field error can be divided into various components of which the six most commonly used are: translation, rotation, scale, non-orthogonality, wafer stage distortion and stage yaw. See Matching Performance for Multiple Wafer Steppers using and Advanced Metrology Procedure, supra. In order to measure and quantify the overlay error that exists between device layers special overlay target patterns may be printed in designed locations across the wafer at each lithographic processing step. If the two patterned layers are perfectly aligned to each other the overlay target patterns will be aligned with each other. For example if a box-in-box target pattern were used, a centered box in box structure 2102 as illustrated in FIG. 21 would result. Any positional offset or misalignment of the box-in-box target pattern 2104 is a measure of the overlay error, illustrated in FIG. 21.

Figure 1:
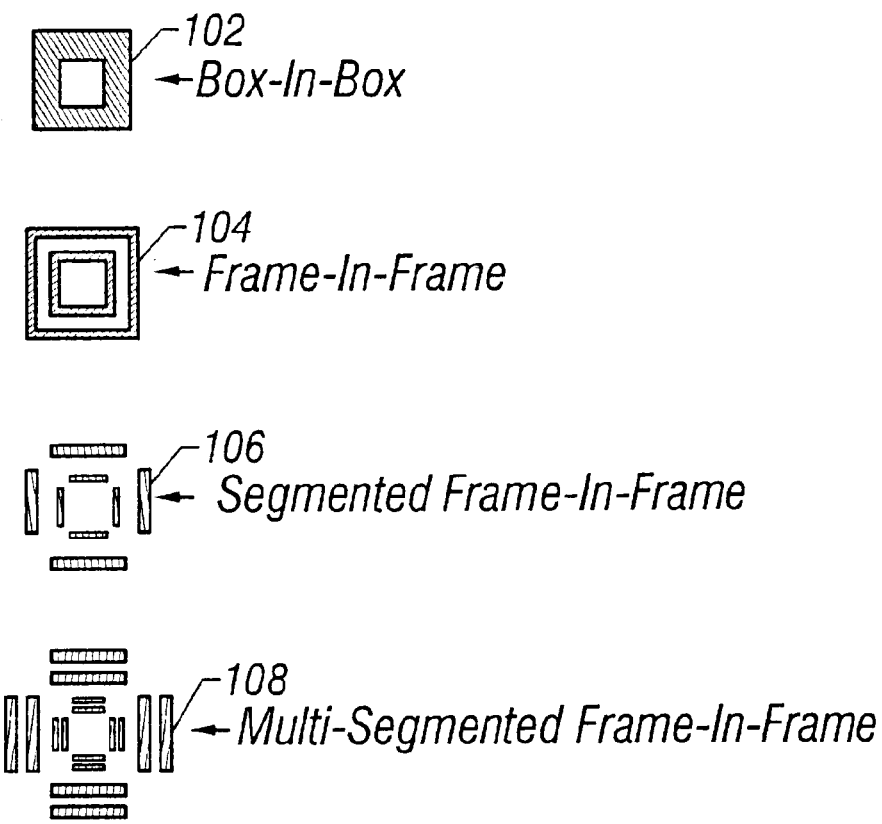
FIG. 1 is a schematic showing typical overlay patterns or completed alignment attributes.
Figure 2:
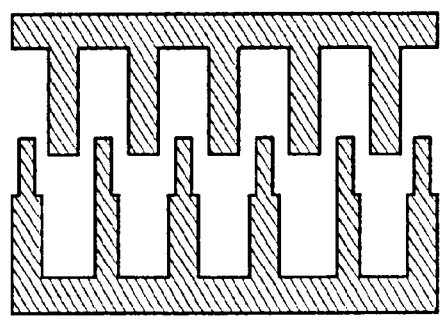
FIG. 2 is a schematic showing typical optical verniers.
Figures 18, 19, 20:
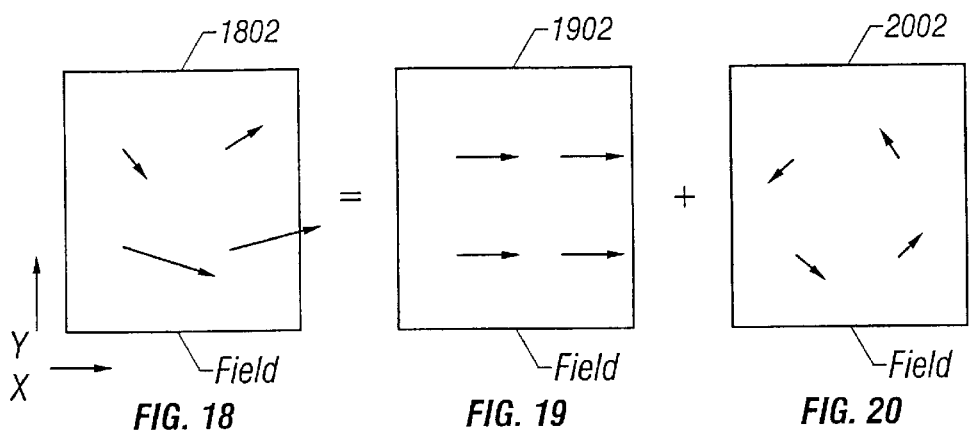
FIG. 18 is a schematic showing an overlay error vector plot.
FIG. 19 is a schematic showing a translation overlay vector plot.
FIG. 20 is a schematic showing a rotation overlay vector plot.

FIG. 1 shows a variety of different overlay target patterns. There are many types of alignment attributes or overlay target patterns, for example, a box-in-box 102, a frame-in-frame 104, a segmented frame-in-frame 106, and a multi-segmented frame-in-frame 108 as shown in FIG. 1, optical verniers as shown in FIG. 2, and gratings. The positional offset of these different target pattern is measured with a commercial optical overlay metrology tool. In some cases, the overlay error can be measured using the projection imaging tool's alignment system. See Matching Management of Multiple Wafer Steppers Using a Stable standard and a Matching Simulator, supra. Vector displacement plots as illustrated in FIGS. 18, 19 and 20, can be used to give a visual description of the direction and magnitude of overlay error are mathematically separated into different spatial components using a variety of regression routines. For example, an overlay plot 1802 illustrated in FIG. 18 includes a translation component 1902, illustrated in FIG. 19, plus a rotation component 2002, illustrated in FIG. 20.

There are many commercial software packages that can be used to model and statistically determine the intra-field error components for the purpose of process control and exposure tool set-up. See, for example, (Monolith (See A Computer Aided Engineering Workstation for Registration Control, supra), Klass II (Lens Matching and Distortion Testing in a Multi-Stepper, Sub-Micron Environment, supra)). Once determined, the intra-field error components are analyzed and used to adjust calibration constants of the wafer handling stage to improve pattern alignment. In addition, because different exposure tools are used to produce a given device the exposure tools must be matched or fingerprinted and adjusted so that registration errors unique to one tool are removed or minimized as much as possible. See Mix-and-Match: A Necessary Choice, supra.

Golden Wafers

Finding the relative magnitude of wafer stage placement error, commonly uses a process of creating and using a "golden wafer". Using a golden wafer, the wafer stage placement error can be measured semi-independent of other sources of registration error. Semiconductor manufacturing facilities typically use the resulting placement error information to manually or automatically adjust the wafer stage and stepper alignment system in such a way so as to minimize the impact of overlay error. See Matching Management of Multiple Wafer Steppers Using a Stable standard and a Matching Simulator, supra; Matching Performance for Multiple Wafer Steppers using and Advanced Metrology Procedure, supra.

Figure 3:
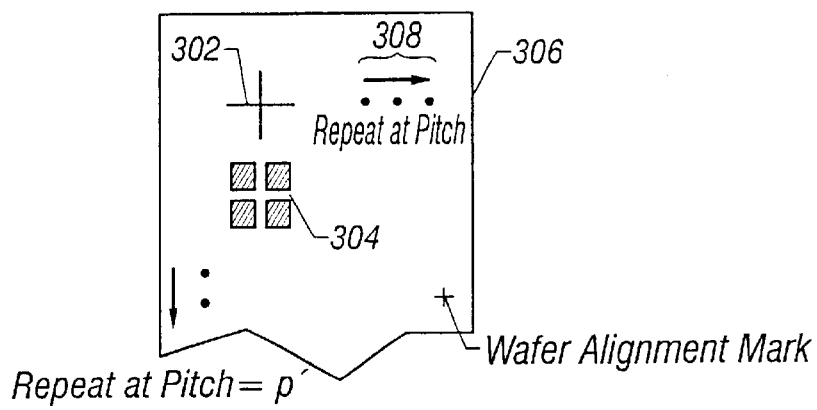
FIG. 3 is a schematic showing a reticle.
Figure 5A:
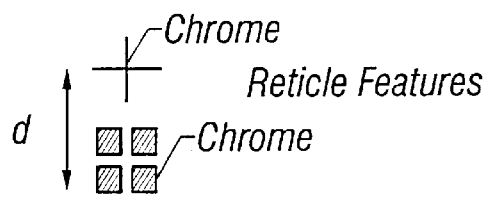
FIG. 5A is a schematic showing additional details of the reticle of FIG. 3.
Figure 5B:
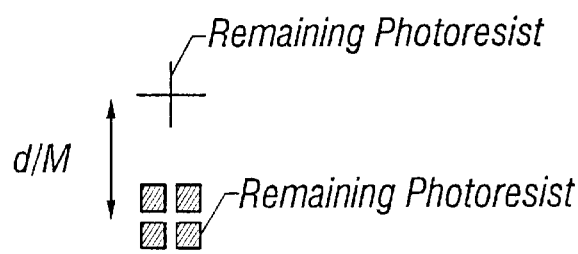
FIG. 5B is a schematic showing additional details of FIG. 5A in developed positive photoresist.

FIG. 3 shows a typical set of geometrically placed overlay target patterns consisting of a matching pair of male 302 and female targets 304. The male 302 and female 304 targets may be regularly spaced across a wafer stage test reticle 306 as shown in FIG. 3. FIGS. 5A and 5B show additional detail of the reticle shown in FIG. 3.

Figure 22:
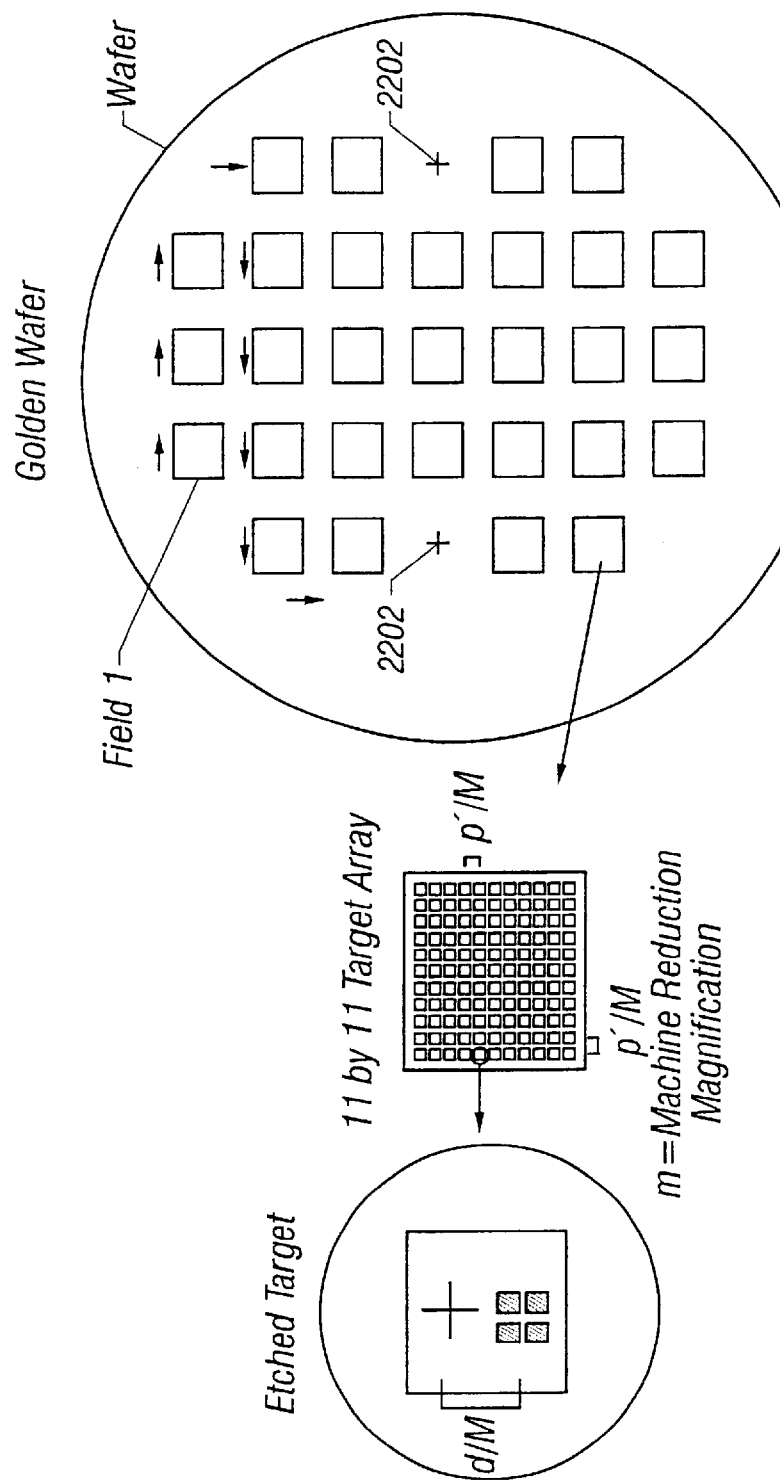
FIG. 22 is a schematic showing an example of a golden wafer.

It should be noted that typically the chrome target patterns on most reticles are 4 or 5 times larger as compared with the patterns they produce at the image plane, this simply means modem semiconductor projection imaging tools are reduction systems. Further, (by measuring the reticle and then applying these corrections) the overlay target patterns are placed in nearly perfect geometric positions on the wafer stage test reticle. For example, first, a photoresist coated wafer is loaded onto an exposure tool or stepper wafer stage and globally aligned. Next, the full-field image of the reticle is exposed several times at various positions across the surface of the photoresist coated wafer as illustrated in FIG. 22. In addition, several wafer alignment marks 2202 may also be printed across the wafer using the reticle as illustrated in FIGS. 3 and 22. For example, the full-field of the reticle 306 may consist of an 11 by 11 array of male 302 and female 304 targets evenly spaced at pitch p' 308, across the reticle surface [FIG. 3]. The pattern is then sent through the remaining portions of the lithographic patterning process to delineate the resist pattern. Finally, the patterned wafer is etched and the alignment attributes are permanently recorded in the wafer surface. This permanently etched wafer is called a golden wafer.

Figure 4:
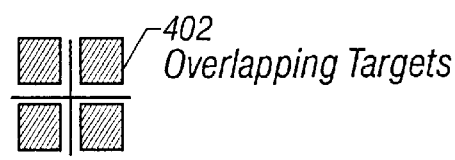
FIG. 4 is a schematic showing overlapped male and female target pairs.

In general, the golden wafer may be used to extract stage errors on any photolithographic exposure tool in the following way. The golden wafer is loaded onto the wafer stage in question and aligned into position using the previously placed wafer alignment marks 2202 illustrated in FIG. 22. Next, the wafer stage is moved so as to align the reticle 306 illustrated in FIG. 3 containing, for example, an 11 by 11 array of male targets 302 directly on top of the first full-field exposure pattern containing an 11 by 11 array of female 304 targets resulting in overlapping targets 402 as illustrated in FIG. 4 [FIGS. 4, 22]. Making these overlapping targets involves shifting the wafer the small increment d/M so male and female targets lie on top of one another. When the stepper has finished the alignment procedure the x,y wafer stage coordinates and overlay error associated with several male-female targets is electronically recorded. This step, align and record procedure is repeated across a desired portion of the wafer for each full-field 11 by 11 exposure pattern. The electronically recorded target coordinates and overlay errors may then be entered into a statistical modeling algorithm to calculate the systematic and random components of inter-field and intra-field overlay error. It is important to note that the resulting inter-field or wafer stage overlay error not yield the unique overlay error of the wafer stage in question. Rather, it can only be used to report the inter-field or wafer stage overlay error as referenced to a golden wafer that was produced on another reference machine. In general, semiconductor manufacturers always rely on some kind of stage matching or cross-referencing technique to calculate the relative wafer stage overlay error.

There are several problems associated with the golden wafer technique. First, as noted above, the technique does not yield the unique wafer stage overlay error for the machine in question, it only provides a relative measure of all components. To obtain the relative stage error between two machines, the inter-field errors of each machine are determined an then subtracted from each other resulting in an increase in the noise in the stage error determination. Second, the models used to calculate the systematic inter-field error usually do not account for the stage error associated with distortion and yaw. These models are typically limited to translation, rotation, orthogonality and x and y scale errors (See A Computer Aided Engineering Workstation for Registration Control, supra), higher order errors are ignored or otherwise not taken into account. Relying on golden wafers created on a reference machine, results in wafers that are not identical, or have overlay deviations from one another even if they are exposed on a single machine in a short time to minimize machine instabilities. See Matching Management of Multiple Wafer Steppers Using Stable standard and a Matching Simulator, supra. It would be very desirable to have an inter-field overlay technique that could determine overlay error independenty from a cross referenced golden wafer. See Mix-and-Match: A Necessary Choice, supra.

Reference Machine

Figure 23:
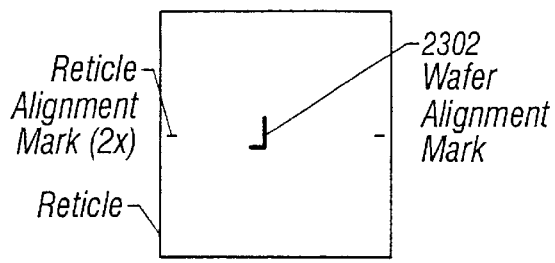
FIG. 23 is a schematic showing a wafer alignment mark reticle.
Figure 24:
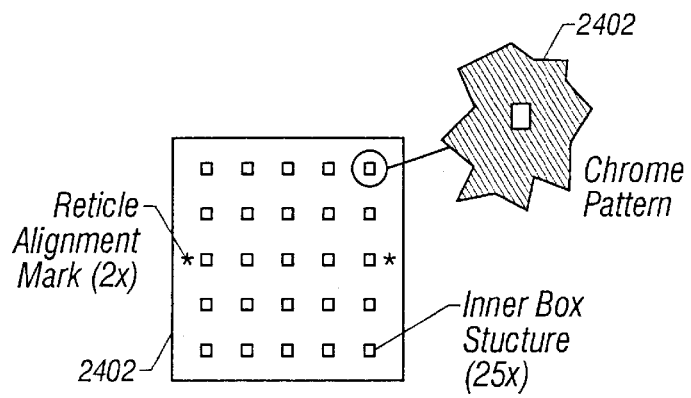
FIG. 24 is a schematic showing an inner box reticle.
Figure 25:
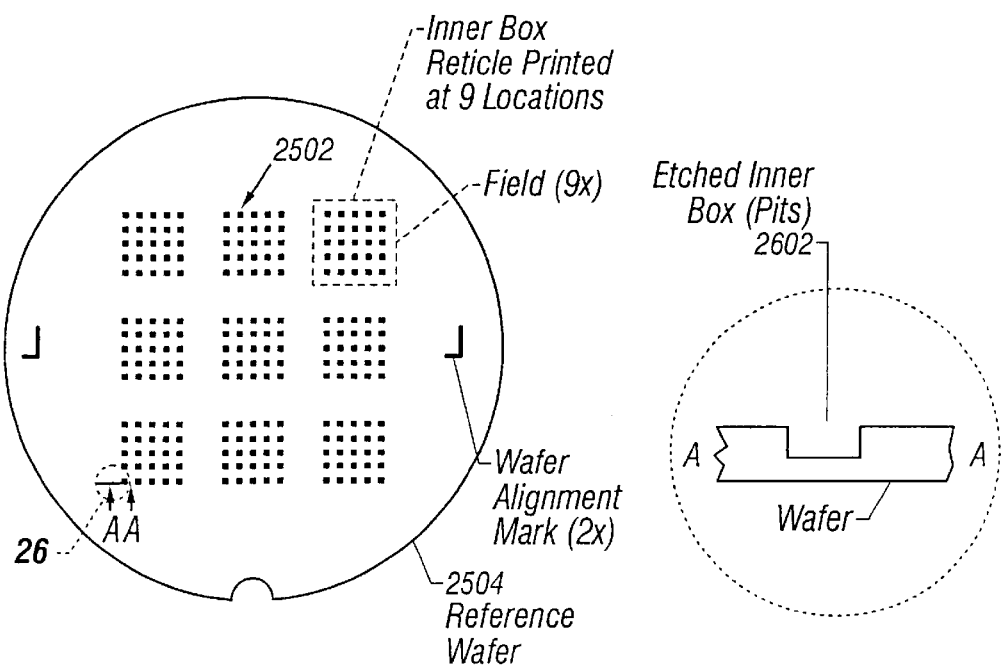
FIG. 25 is a schematic showing an example of a golden wafer layout.
Figure 26:
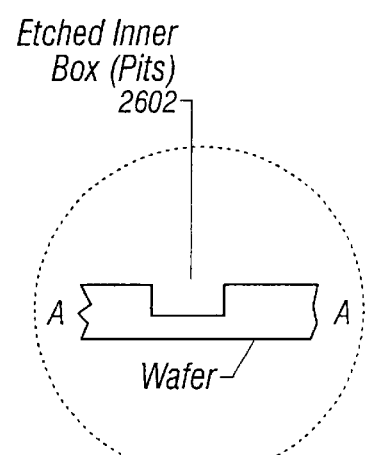
FIG. 26 is cross sectional view of an inner box.

Another technique utilizes a reference machine (projection imaging tool) for measurement of inter-field overlay error (See Matching Performance for Multiple Wafer Steppers using and Advanced Metrology Procedure, supra; Expanding Capabilities in Existing Fabs with Lithography Tool-Matching, supra). The reference machine is typically one that is closest to the average of all machines in the factory (Expanding Capabilities in Existing Fabs with Lithography Tool-Matching, supra) or a machine that exhibits long term stability. See Matching Performance for Multiple Wafer Steppers using and Advanced Metrology Procedure, supra. On the reference machine, a golden wafer is exposed, developed and etched. The golden wafer is exposed using a desired target, for example, an inner box reticle 2402 as illustrated in FIG. 24 that contains a regular array of inner box structures in a regular pattern covering the wafer, such as a 3×3 array 2502 as shown in FIG. 25. Next, wafer alignment marks are exposed using a designated portion of the inner box reticle or a separate reticle containing the wafer alignment mark 2302 illustrated in FIG. 23. The golden wafer is then typically etched and stripped to produce pits 2602 illustrated in FIG. 26 corresponding to the inner box locations.

Figure 27:
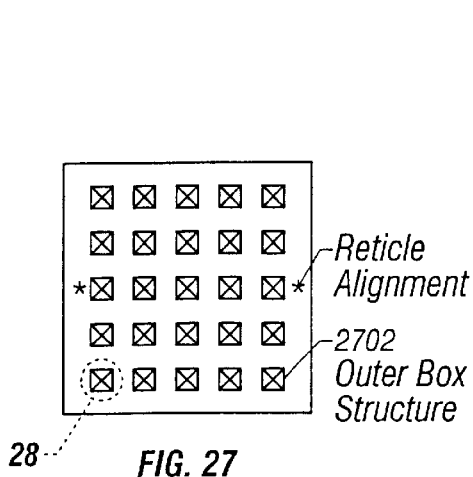
FIG. 27 is a schematic showing an outer box reticle.
Figure 28:
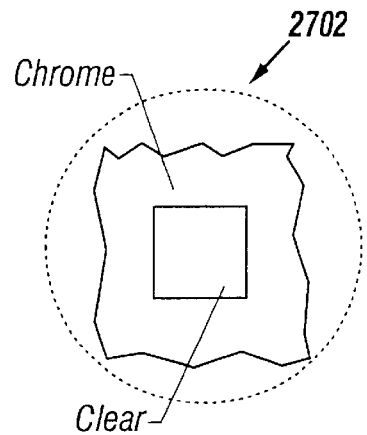
FIG. 28 is a schematic showing additional detail of an outer box reticle.

A number of such wafers may be produced and the locations of the inner box arrays (individual printings of the inner box reticle) then represent the inter-field positions of the reference machine. Next, a reticle containing outer box structures 2702 illustrated in FIGS. 27 and 28 in the same nominal positions as the inner box reticle (or the pattern required to produce a completed, machine readable alignment attribute (complementary pattern)), the outer box reticle, is placed on the machine to be measured, a completed golden wafer 2504 in FIG. 25 is coated with photoresist, exposed and developed. The result is a developed golden or reference wafer 2902 illustrated in FIG. 29, containing box in box structures that can then be measured on an overlay metrology tool. FIG. 30 is a cross sectional view of a typical box-in-box structure shown in FIG. 29.

Figure 29:
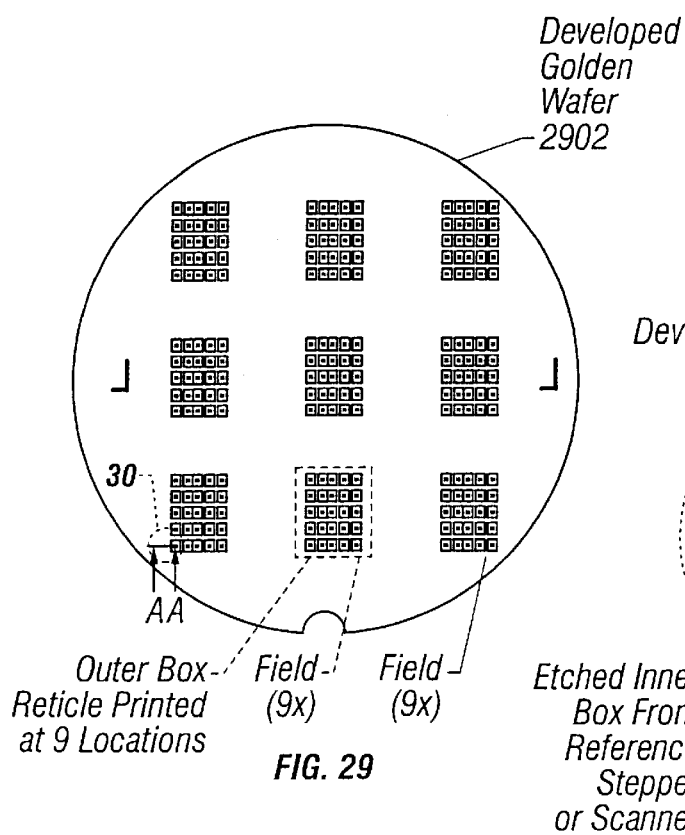
FIG. 29 is a schematic showing an example of a golden wafer for overlay measurement.
Figure 30:
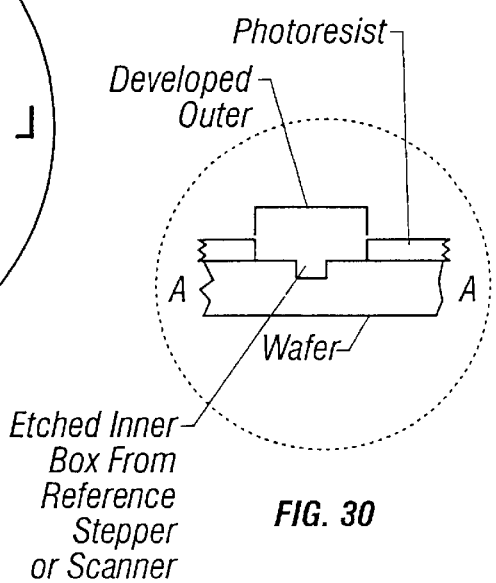
FIG. 30 is a cross section of a box in box.

The resulting measurements are then typically averaged over each field, for example, in FIG. 29, the twenty-five measurements within each field would be averaged together to produce a net translation (Dxg, Dyg) and rotation (Yawg) for each of the nine fields. This averaged data is then fit to the following set of equations. See Matching of Multiple Wafer Steppers for 0.35 Micron Lithography using Advanced Optimization Schemes, M. van den Brink et al., SPIE Vol. 1926, 188:207, 1993; Matching Performance for Multiple Wafer Steppers using and Advanced Metrology Procedure, supra:

$$Dxg = Txg + sxg*xg + (-qg+qog)*yg + D2x*yg^2 + Rwx \quad (Eq\ 1)$$

$$Dyg = Tyg + syg*yg + qg*yg + D2y*xg^2 + Rwy \quad (Eq\ 2)$$

$$Yawg = Qg + syawg*yg - 2*D2y*xg + Rwy \quad (Eq\ 3)$$

Where:
Dxg, Dyg, Yawg=x,y,yaw grid errors at grid position xg, yg
xg, yg=grid position=position on wafer with respect to the center of stage travel
Txg, Tyg=x,y grid translation
sxg, syg=x,y grid scale or magnification error
qg, qog=grid rotation, orthogonality
D2x, D2y=x,y stage bow terms
Rwx, Rwy, RwY=grid residual in the x, y, Yaw direction (we do not try fitting to these parameters).

The Yaw error (Yawg) is the deviation of the rotation of the projected field at a specific point. It results in a difference in field to field rotation as a function of placement position (xg, yg) on the wafer. The 10 unknown parameters (Txg, Tyg, . . . D2x, D2y) in Equations 1, 2, 3 are solved for using least squares techniques. See Numerical Recipes, The Art of Scientific Computing, W. Press et al., Cambridge University Press, 509:520, 1990.

Problems with this technique include the systematic (repeatable) and random grid errors on the reference machine (the machine used for creating the golden wafers) are permanently recorded as half (inner or outer box) of our factory wide metrology standard. The magnitude and distribution of these errors is entirely unknown. For machine to machine comparisons of grid errors, the systematic part of the errors cancel out but the influence of the random or non-repeatable errors remains. To try and overcome this problem typically, multiple golden or reference wafers are used to improve machine to machine matching results. See Matching Management of Multiple Wafer Steppers Using a Stable standard and a Matching Simulator, supra. Furthermore, reference machine instabilities over time lead to a drift or error in the factory wide standard represented by the reference machine. Yet another problem with this technique is that because it utilizes fall size projected fields to determine the inter-field errors, it does not work with partially exposed fields 3202 illustrated in FIG. 32. The ability to include partially exposed fields is important because product wafers typically contain multiple die within an exposure field and therefore the inter-field error of partially exposed fields directly affects the edge die overlay error.

Reference Reticles

Figure 13A:
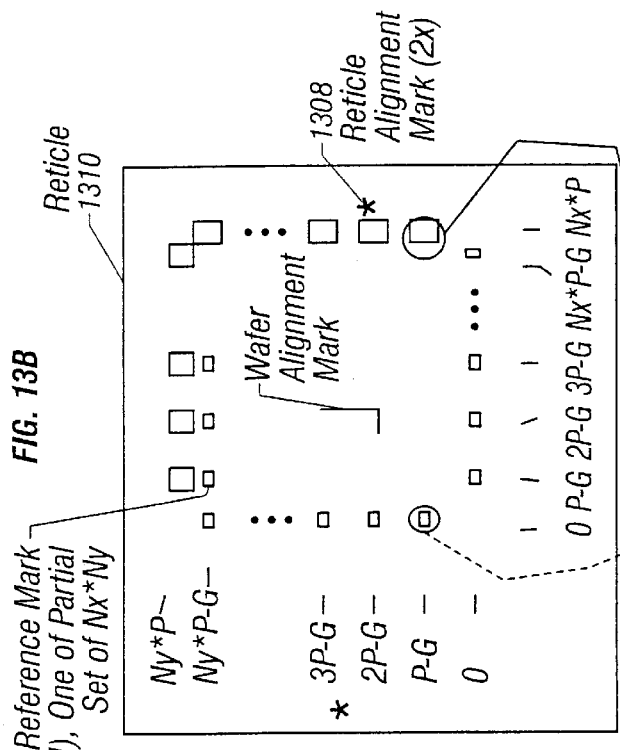
FIG. 13A is a schematic showing a reference reticle.
Figure 15:
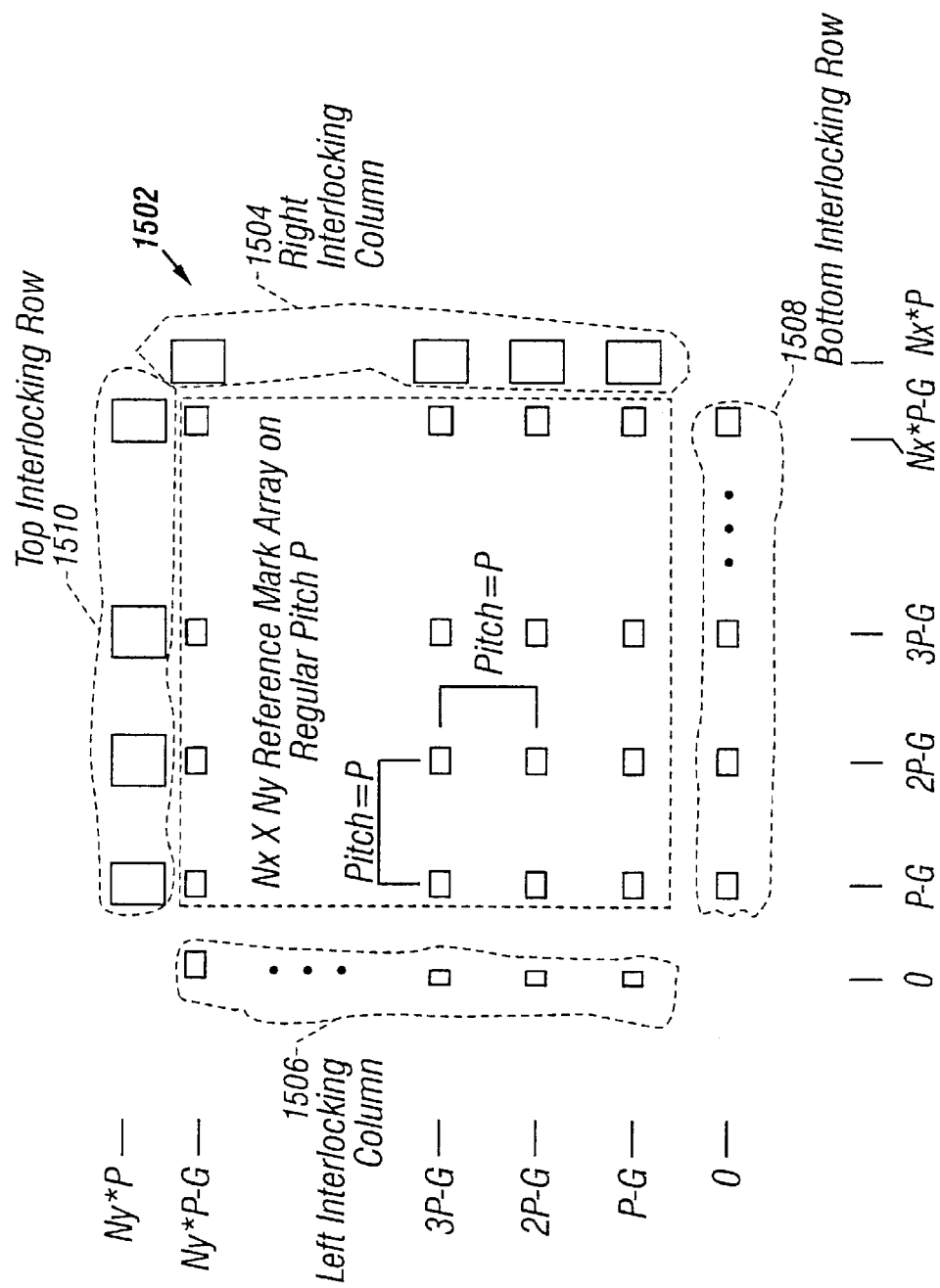
FIG. 15 is a schematic showing a further explanation of the components of the interlocking array of the reference reticle.

FIG. 13A shows a reference reticle 1310 containing an Nx+2 by Ny+2 array of overlay targets or box structures used for creating the basic interlocking array pattern on a substrate. The substrate may be different materials, for example, a silicon wafer, a quartz wafer, a flat panel display, a reticle, a photo-mask, or a mask plate, This reticle 1310 creates the basic periodic grid on a wafer with pitch P/M (M is the reduction magnification ratio of the projection imaging tool) and also creates the features that overlap or interlock from field to field and thereby improve accuracy. FIG. 15 illustrates additional detail of the components of the interlocking array. In the middle is an Nx X Ny reference mark array 1502 on pitch P. These features become part of the wafer scale P/M grid and include a set of inner boxes 1304 as detailed in FIG. 13A. On the right side of FIG. 15 is the right interlocking column 1504. It consists of an Ny long set of outer boxes 1304 detailed in FIG. 13A, at the indicated X and Y positions. The position of this column is determined so that the inner boxes in the left interlocking column 1506 of a subsequent exposure of the reticle, precisely overlap them on the wafer when the interlocking array is stepped and printed an X distance Sx=Nx*P/M at the wafer.

Figure 12:
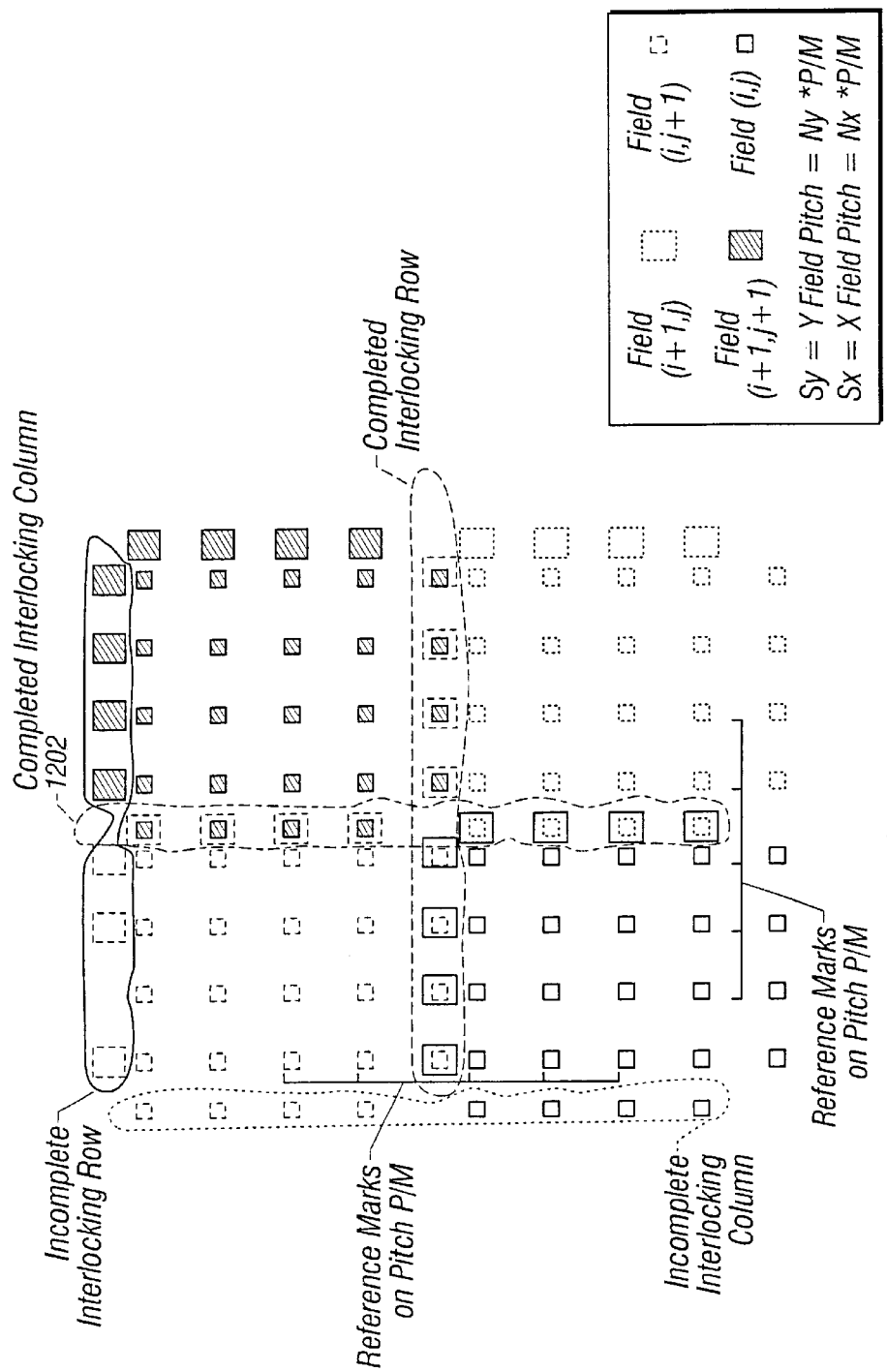
FIG. 12 is a schematic showing additional detail of the interlocking of fields in X and Y directions on reference wafers.

The left interlocking column 1506 includes an Ny long set of inner boxes that are off pitch (by the amount G) relative to the Nx X Ny reference mark array. The left interlocking column is off pitch (P-G spacing in FIG. 13A), so that an array of reference marks uninterrupted by field boundaries can be created and also be able to create a system of interlocking columns 1202 as shown in FIG. 12.

FIG. 15 also details the position of the bottom 1508 and top 1510 interlocking rows, both of which contain Nx features. Their function and location is analogous to the function and position of the left 1506 and right 1504 interlocking columns respectively. The relative Y position of the top 1510 and bottom 1508 interlocking rows is determined to overlap the inner boxes of the bottom interlocking row when the projected field is stepped a distance Sy=Ny*P/M at the wafer.

Figure 13B:
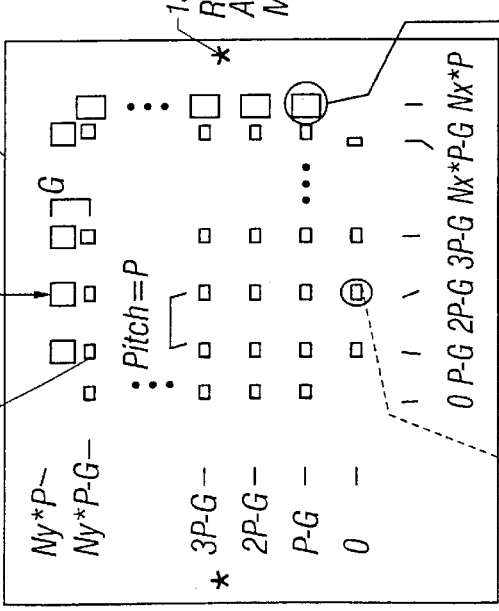
FIG. 13B is a schematic showing a reference reticle that includes wafer alignment marks.

In addition to the reference reticle of FIG. 13A, another reference reticle containing wafer alignment marks is provided as illustrated in FIG. 13B. The description and layout of this reticle is identical to the description above, the only difference is that where the wafer alignment mark of FIG. 13B either covers a reference mark within the Nx X Ny reference array, or where the design rules for the wafer alignment mark dictate prescribed featureless areas, this reticle will contain no reference array marks. There will be a wafer alignment mark present or more typically several wafer alignment marks, one for each tool type used in the fab. The reticle containing the full interlocking array, FIG. 13A, and any reticles with wafer alignment marks, FIG. 13B, are then sequentially loaded and aligned on the projection imaging tool (machine) on which we will be manufacturing reference wafers.

Figure 13C:
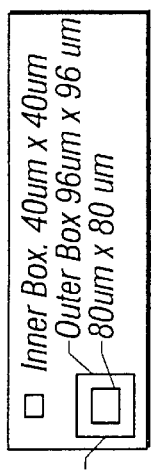
FIG. 13C is a schematic showing exemplary inner and outer box sizes.

FIG. 13C illustrates some typical inner and outer box sizes, for use on an M=4 or 5 stepper or scanner while a typical reticle pitch P=10 mm and offset G=0.5 mm. For these parameters Nx and Ny may be selected so that Nx=NY=8 thus allowing for the manufacture of reference wafers on either standard field steppers or scanners.

Wafers

As described above in block 604 of FIG. 6, wafers are then provided. These wafers can be, for example, blank silicon or quartz (See Matching Management of Multiple Wafer Steppers Using a Stable standard and a Matching Simulator, supra) and may possibly be laser scribed with an appropriate wafer id number for future identification 3304 as shown n FIG. 33. If desired, the silicon reference wafers can be coated with a thin film of silicon nitride or silicon dioxide before continuing (quartz wafers would typically be chrome coated). Next, the wafer is coated with resist and loaded onto the wafer stage of the machine.

Interlocking Reference Mark Exposures

Figure 16A:
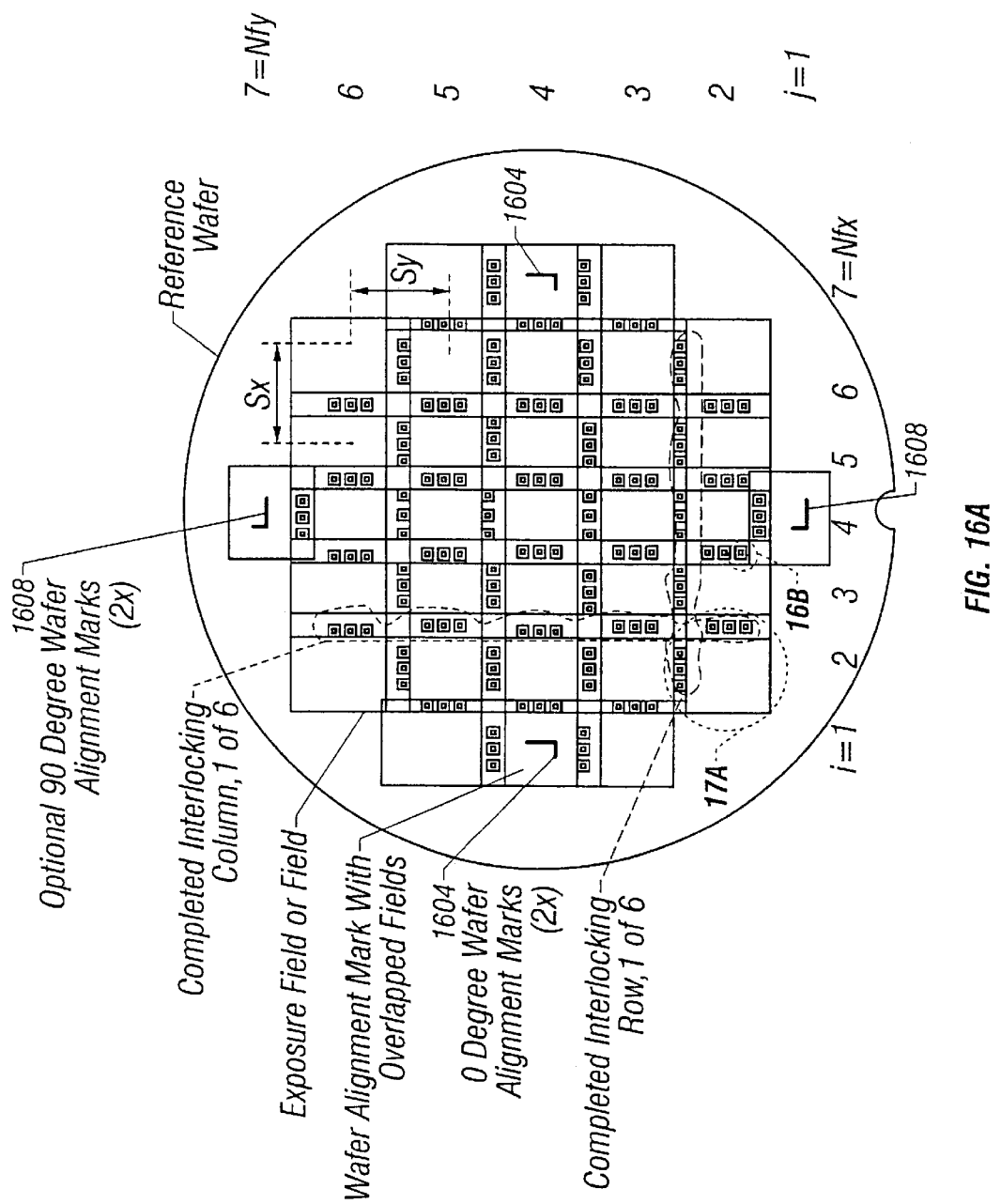
FIG. 16A is a schematic showing a tiled or interlocking schematic of the reference wafer.

A series of exposures, each containing an Nx+2 by Ny+2 array of box structures, is made in an overlapping interlocking pattern. FIGS. 12 and 16A are examples of an interlocking pattern. Following the first exposure, subsequent exposures in the same row are separated by a distance of Sx=Nx*P/M or the distance between the leftmost inner box of the projected field and the rightmost outer box of the field. Subsequent exposures in the same column are separated by a distance of Sy=Ny*P/M or the distance between the inner box at the bottom of the projected field and the topmost outer box within the projected field. P is the reticle pitch of reference marks within the Nx X Ny reference mark array as shown in FIG. 15. M is the reduction magnification ratio of the machine. This field placement pattern creates an interlocking array of fields. FIG. 12 shows additional detail of the interlocking array and FIG. 16A shows a schematic of the entire resulting wafer.

Figure 16B:
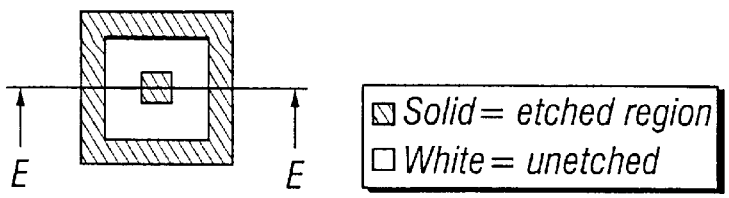
FIG. 16B is a plan view showing an interlocking measurement site.
Figure 16C:
FIG. 16C is a cross sectional view of an interlocking measurement site.
Figure 17A:
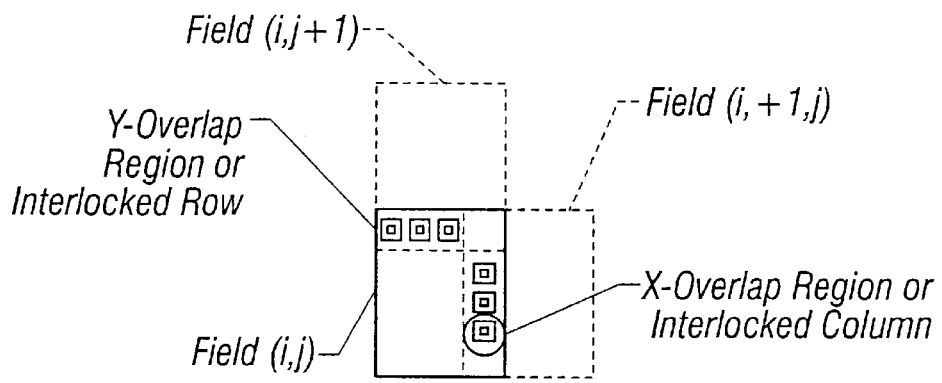
FIG. 17A is a schematic showing typical overlapping regions showing 3 box in box overlay targets.
Figure 17B:
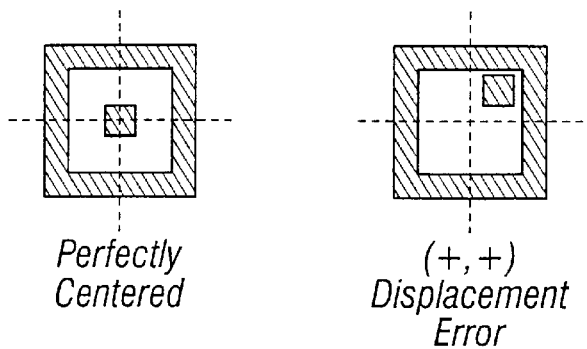
FIG. 17B is a schematic showing examples of completed alignment attributes (box in box).

An example of the final interlocking exposure pattern is shown in FIG. 16A. It forms an NfxxNfy rectangular array of fields, the only missing fields being those allocated for wafer alignment marks or where a field position is not desired. FIG. 16B is a plan view of an interlocking measurement site and FIG. 16C is a cross sectional view of interlocking measurement sites of FIG. 16B. FIG. 17A is a diagram showing typical overlapping regions of three box-in-box overlay targets. FIG. 17B illustrates a perfectly centered overlay target box measurement site and sign conventions for displacement.

Figure 32:
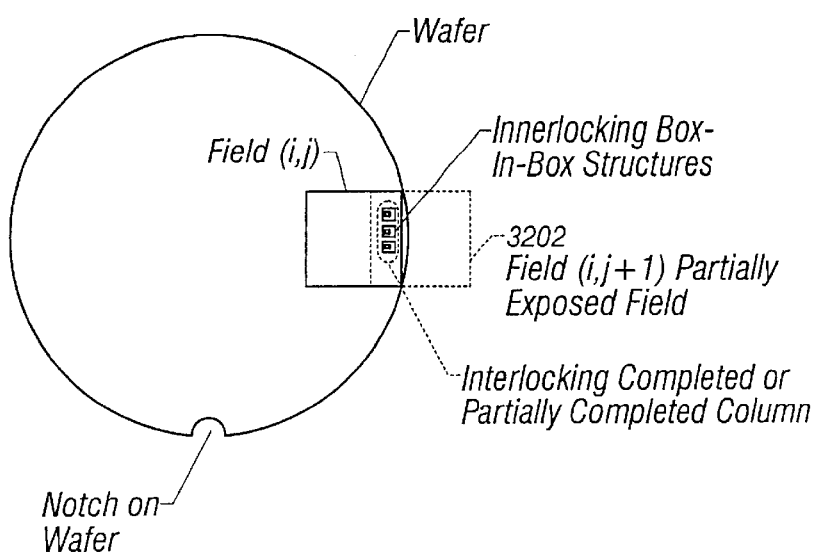
FIG. 32 is a schematic showing a partially exposed field.

The NfxxNfy array can contain partially exposed fields 3202 as shown in FIG. 32, where the entire field is not printed on the wafer. These partial fields are important because the large exposure fields in modem steppers and scanners allow for multiple product die within a field (such as illustrated in Nikon Lithography Tool Brochures (Japanese), Nikon). Thus partially exposed fields 3202 can print multiple product die while not exposing the entire field. Because overlay error tends to be worse near the edges of the wafer, it is beneficial to have reference marks near the reference wafers' edge (See A New Approach to Correlating Overlay and Yield, supra). For the partially exposed field 3202 to be usefully included on the reference wafer, at least two completed or overlapped box in-box structures should be present along the partially exposed fields' interlocking rows or columns. This facilitates determining the position of the partially exposed field relative to the other fields in the reference wafer.

Wafer Alignment Mark Exposures

Next the reference reticle containing the wafer alignment marks, as shown in FIG. 13B, is loaded into the exposure position on the machine. The wafer alignment marks are exposed in openings in the previously defined NfxxNfy field array and placed so that its interlocking rows and columns interlock or overlap the interlocking rows and columns already placed with the previous reference reticle. The result is schematically shown in FIG. 16 where two wafer alignment marks 1604 suitable for a 0 degree wafer orientation have been printed. The left wafer alignment mark (FIG. 16A, field i=1, j=4) overlaps the previously placed reference reticle array along its top and bottom interlocking rows and along its right interlocking column while the right wafer alignment mark (FIG. 16A, field i=7, j=4) overlaps the previously placed reference reticle array along ts top and bottom interlocking rows and along its left interlocking column. Additional (optional) wafer alignment marks 1608 suitable for a 90 degree wafer orientation and interlocked into the field pattern are also shown.

Develop, Etch, Strip

After the last exposure is complete, the wafer is removed from the wafer stage and sent through the final resist development steps. Next, the alignment attributes and wafer alignment marks for each reference wafer are permanently etched into the reference wafer using a standard semiconductor etch process. The remaining resist is then stripped. An additional overcoating (SiO2 overcoating, for chrome over quartz) is possibly provided. FIGS. 35A–35F show a variety of vertical cross sections for the resulting reference mark (in this instance an inner box). The dashed vertical lines are the silicon wafer (or other substrate) while the diagonal lines represent a pre or post exposure deposited or overcoated layer. Thus in the case of a silicon wafer provided before exposure with a silicon dioxide, polysilicon, amorphous silicon, or silicon nitride coating, the reference marks would have the cross section of FIG. 35C. Other vertical structures are clearly possible.

Measure Interlocking Rows And Columns

Figure 6:
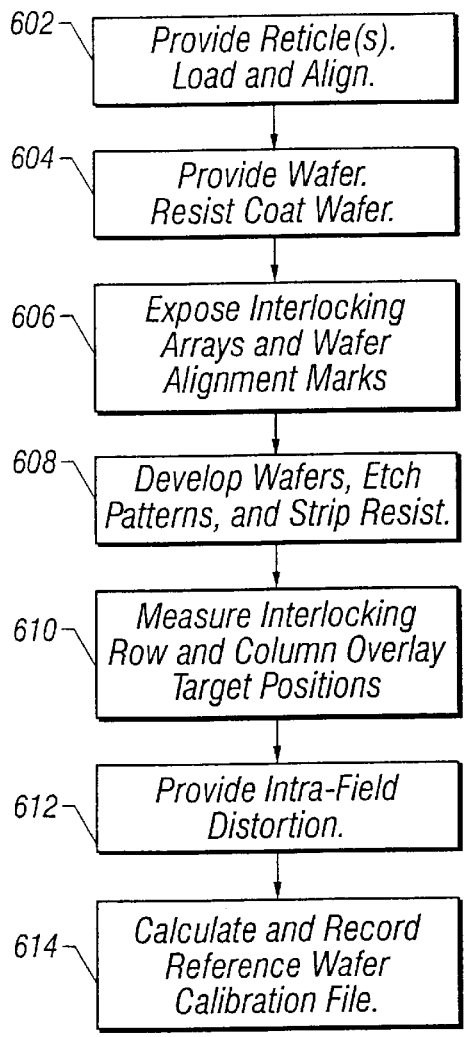
FIG. 6 is a flow chart of an embodiment for creating reference wafers.
Figures 33, 34:
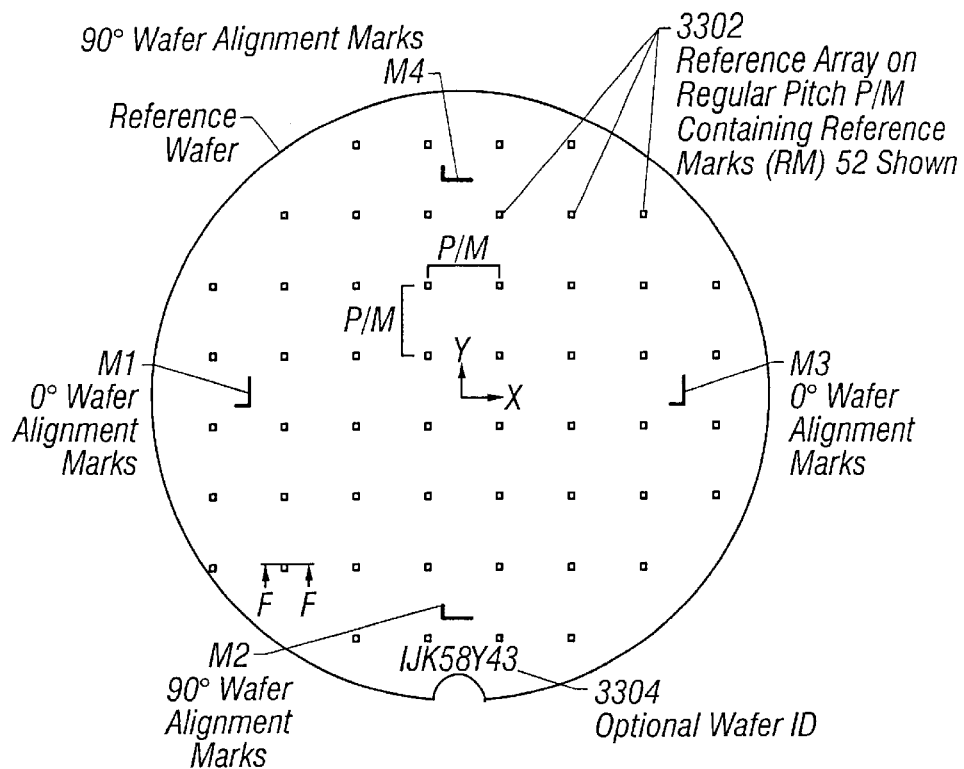
FIG. 33 is a schematic showing the operational portions of a completed reference wafer.
FIG. 34 is a block diagram showing an exemplary calibration file for a reference wafer.

Referring to block 610 of FIG. 6, at this point, the interlocking array row and column overlay target positions are measured. That is, the overlay errors present in the completed alignment attributes (box in box structures) present along the interlocking rows and columns (FIG. 12 in detail and FIG. 16A schematically) of the reference wafer are measured. In general, at least two distinct box-in-box overlay targets should be measured along each edge (top, bottom interlocking row and left, right interlocking column) of the interior fields. Referring to FIG. 16A, a field (i,j) is an interior field if all of its neighboring fields interlocking rows and columns are completely present on the wafer. For other fields, typically, at least 2 distinct measurements altogether distributed amongst its interlocking rows and columns in the overlapping regions. Increasing the number of measurements along the interlocking rows and columns is desirable because this may increase the accuracy of the resulting calibration file, as shown in FIG. 34, that characterizes the reference wafer. The aforementioned alignment attributes or box-in-box along the interlocking rows and columns are then measured by an overlay metrology tool such as a KLA-Tencor model 5105 or 5200 (See KLA 5105 Overlay Brochure, supra; KLA 5200 Overlay Brochure, supra) or Bio-Rad Semiconductor Systems Quaestor Q7. See Quaestor Q7 Brochures, supra. The resulting overlay data set is saved and entered into a computer algorithm for analysis and the overlay positional coordinates of the alignment attributes are computed and then saved for the subsequent calculation of the calibration file.

Intra-Field Distortion

Referring to block 612 of FIG. 6, the intra-field or within the exposure field distortion pattern of the machine being used to create the reference wafer is provided. This can come from a variety of sources since a number of techniques are available for the determination of the intra-field distortion (dxf, dyf). One technique is described by Smith, McArthur, and Hunter, "Method And Apparatus For Self-Referenced Projection Lens Distortion Mapping", U.S. provisional application serial No. 60/254,271 filed Dec. 8, 2000 and U.S. patent application Ser. No. 09/835,201 of the same title filed Apr. 13, 2001. These patent applications describe a self referencing technique that can be carried out using overlay metrology tools widely available in semiconductor factories and allows for highly accurate determination of the intra-field distortion (dxf, d ) over a set of grid points within an x, y translation, rotation, and overall scale or symmetric magnification factor. Another technique is to expose on a photoresist coated wafer, a reticle pattern containing simple crosses or squares as illustrated in FIG. 24 that are located at the desired intra-field grid positions illustrated in FIG. 31. The wafer is then developed and the position of the resulting grid of boxes is measured using an absolute metrology tool such as a Leica LMS2000, Leica IPRO (Leica Microsystem, Wetzlar, Germany, (See Leica LMS IPRO Brochure, Leica), Nikon 51 or Nikon 61 (Nikon, Tokyo, Japan, (See Measuring System XY-51, K. Kodama et al., SPIE Vol. 2439, 144:155, 1995)).

The technique described above is highly accurate but absolute metrology tools are not widely available in semiconductor factories and so it typically is not used. Yet another technique involves assuming that the machines' inter-field or stage errors are small over the dimensions occupied by a single field, then printing a small field where a single inner box on a reticle is stepped around by the wafer stage to a grid of locations in the field. Then another reticle containing an array of complementary outer boxes covering the full image field is printed over the inner boxes and the resulting box in box measurements are directly interpreted as the intra-field distortion. See A "Golden Standard" Wafer Design for Optical Stepper Characterization, supra. This technique is the least accurate and least preferred. With all of these techniques, the overall scale or symmetric magnification is determined with a greater or lesser degree of accuracy, more on this below.

Calculate Calibration File

Referring to block 614 of FIG. 6, the reference wafer calibration file calculated. This is the step that creates a unique calibration file for each reference wafer. Because the intra-field errors are known, they can be combined with the overlay measurements made along the interlocking rows and columns of the reference wafer to determine the stage or inter-field errors. Then combining the determined stage errors with the intra-field errors produces the calibration file that contains the locations of all of the reference marks on a wafer scale periodic grid (P/M=period) and the positions of the wafer alignment marks. The step of determining the inter-field errors uses the techniques described in Smith, McArthur, and Hunter ("Method And Apparatus For Self-Referenced Positional Error Mapping", U.S. provisional application serial No. 60/254,413 filed Dec. 8, 2000 and U.S. patent application Ser. No. 09/891,699 of the same title filed Jun. 26, 2001).

The following model may be used in the determination of the stage errors:

$$BBx(i,j;a,T)=[dxG(i,j+1)+dxf(a,B)-Qg(ij+1)*yfn(B)]$$
$$-[dxG(i,j)+dxf(a,T)-Qg(i,j)*yfn(T)]=dxG(i,j+1)-$$
$$dxG(i,j)-Qg(ij+1)*yfn(B)+Qg(i,j)*yfn(T)+dxf$$
$$(a,B)-dxf(a,T) \quad (\text{Eq 4})$$

$$BBy(i,j;a,T)=[dyG(i,j+1)+dyf(a,B)+Qg(i,j+1)*xfn(a)]$$
$$-[dyG(i,j)+dyf(a,T)+Qg(i,j)*xfn(a)]$$
$$=dyG(i,j+1)-dyG$$
$$(i,j)+Qg(i,j+1)*xfn(a)-Qg(i,j)*xfn(a)+dyf(a,B)-dyf$$
$$(a,T) \quad (\text{Eq 5})$$

$$BBx(i,j;b,R)=[dxG(i+1,j)+dxf(b,L)-Qg(i+1,j)*yfn$$
$$(b)]-[dxG(i,j)+dxf(b,R)-Qg(i,j)*yfn(b)]dxG(i+1,j)-$$
$$dxG(i,j)-Qg(i+1,j)*yfn(b)+Qg(i,j)*yfn(b)+$$
$$dxf(b,L)-dxf(b,R) \quad (\text{Eq 6})$$

$$BBy(i,j;b,R)=[dyG(i+1,j)+dyf(b,L)+Qg(i+1,j)*xfn$$
$$(L)]-[dyG(i,j)+dyf(b,R)+Qg(i,j)*xfn(R)]dyG(i+1,j)-$$
$$dyG(i,j)+Qg(i+1,j)*xfn(L)-Qg(i,j)*xfn(R)+dyf(b,L)-$$
$$dyf(b,R) \quad (\text{Eq 7})$$

Figure 31:
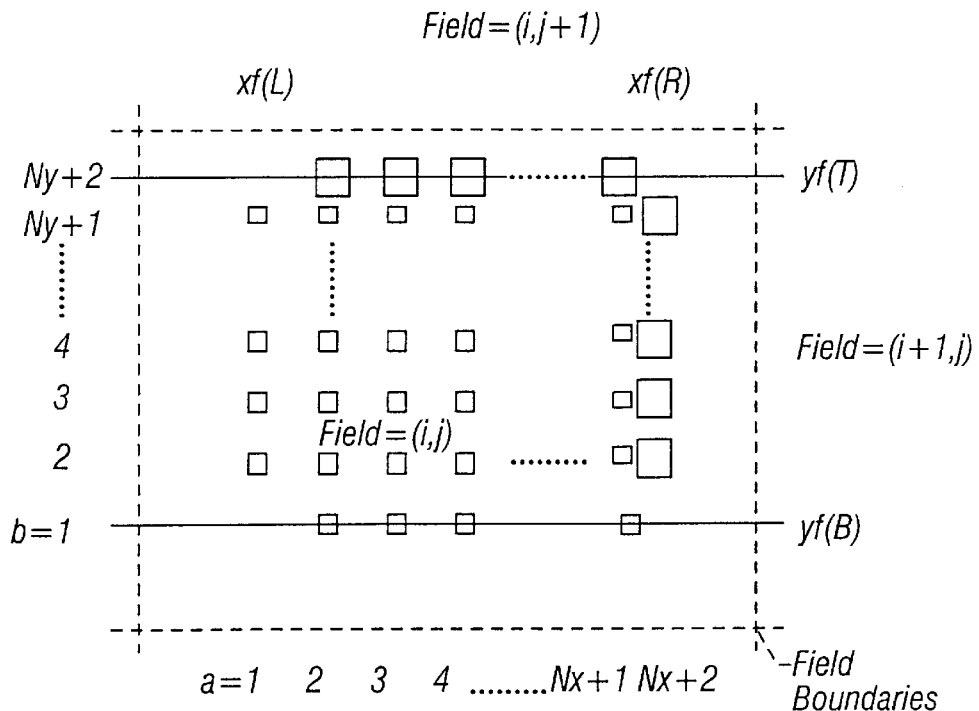
FIG. 31 is a schematic showing inter-field and intra-field indices.

Where:

T, B, R, L=designate the top, bottom, right and left most row or column within each field [see FIG. 31].

(i,j)=field indices [see FIGS. 17A and 31]. i=1:Nfx, j=1:Nfy but not all i, j pairs occur Equations 4–7. If the field or the corresponding measurement set (T or R) does not occur then that equation is absent. That is, i labels fields consecutively left to right while j labels fields consecutively from bottom to top.

(a, b)=intra-field indices or indices corresponding to each feature [FIG. 31], a=1:Nx+2, b=1:Ny+2. That is, a labels features consecutively left to right while b labels features consecutively from bottom to top.

xf(L), xf(R)=x intrafield nominal position of left (a=1), right (a=Nx+2) interlocking columns [FIGS. 15 and 31]. These are known quantities.

yf(T), yf(B)=y intrafield nominal position of the top (b=Ny+2), bottom (b=1) interlocking rows [FIGS. 15 and 31]. These are known quantities.

xfn(a), yfn(b)=(x,y) intrafield nominal position of feature with index (a,b). These are known quantities (see FIG. 15 for relative positions on the reticle);

BBx, BBy(i,j;a,T)=(x,y) measured overlay errors along the top (b=Ny+2) interlocking row of field (i,j) at column a. Thus, "a" covers the range a=2:Nx+1 but the actual number of measurements made along this edge is at the user's discretion subject to the availability of a site on partially exposed fields. See above for the number of measurements required for the purposes of this invention. These are known quantities.

BBx, BBy(i,j;b,R)=(x,y) measured overlay errors along the right (a=Nx+2) edge of field (i,j) at row b. "b" covers the range b=2:Ny+1 but the actual number of measurements made along this edge is at the user's discretion subject to the availability of a site on partially exposed fields. These are known quantities.

dxG(i,j), dyG(i,j), Qg(i,j)=inter-field placement errors in x, y, and yaw or rotation at field (i,j). These are the error terms that characterize the wafer stage stepping. These quantities are solved for, to construct the calibration file.

dxf(b,L), dyf(b,L)=x,y intra-field lens distortions along the left interlocking column (a=1) of the field [FIG. 31]. These are known quantities.

dxf(b,R), dyf(b,R)=x,y intra-field lens distortions along the right interlocking column (a=Nx+2) of the field [FIG. 31]. These are known quantities.

dxf(a,T), dyf(a,T)=x,y intra-field lens distortions along the top interlocking row (b=Ny+2) of the field [FIG. 31]. These are known quantities.

dxf(a,B), dyf(a,B)=x,y intra-field lens distortions along the bottom interlocking row (b=1) of the field [FIG. 31]. These are known quantities.

Thus, all of the quantities in Equations 4–7 are known except the inter-field or grid error (dxG, dyG, Qg)(i,j) which must be solved for. Equations 4–7 are typically over determined in the sense of equation counting (there are more equations than unknowns) but are still singular in the mathematical sense; the null space of Equations 4–7 has a dimension of three. See Numerical Recipes, The Art of Scientific Computing, supra. Now it can be mathematically shown that this 3-dimensional null space corresponds to our inability to uniquely solve for the inter-field error to within an overall X or Y translation and an overall rotation. Put differently, if error (dxG, dyG, Qg)(i,j)) is a solution to Equations 4–7, then (dxG(i,j)+Tx−qg*yG(i,j), dyG(i,j)+Ty+qg*xG(i,j), Qg(i,j)+qg) is also a solution of Equations 4–7 where:

Tx, Ty=arbitrary translation, qg=arbitrary rotation (xG,yG)(i,j) is the nominal center position in wafer coordinates of field (i, j).

To uniquely define a solution we can require that the computed solution have zero values for these modes. Then:

$$\Sigma dxG(i,j)=0 \text{ no } x \text{ translation} \quad (Eq\ 8)$$

$$\Sigma dyG(i,j)=0 \text{ no } y \text{ translation} \quad (Eq\ 9)$$

$$\Sigma yG(i,j)*dxG(i,j)-xG(i,j)*dyG(i,j)=0 \text{ no rotation} \quad (Eq\ 10)$$

$\Sigma$ denotes summation over all inter-field grid point pairs (i, j) whose offsets and yaws are to be determined. Equations 4–7 are typically solved using the singular value decomposition to produce the minimum length solution. See Numerical Recipes, The Art of Scientific Computing, supra. It can be shown that the constraints of Equations 8–10 effectively define a unique solution within the null space of Equations 4–7, and therefore they can be applied after the minimum length solution (dxGm, dyGm, Qg)(i,j) has been determined.

Using Eq 11–13 below we solve for Tx, Ty, qg:

$$\Sigma dxGm(i,j)+Tx-qg*yG(i,j)=0 \quad (Eq\ 11)$$

$$\Sigma dyGm(i,j)+Ty+qg*xG(i,j)=0 \quad (Eq\ 12)$$

$$\Sigma yG(i,j)*(dxGm(i,j)+Tx-qg*yG(i,j))-xG(i,j)*(dyGm(i,j)+Ty+qg*xG(i,j))=0 \quad (Eq\ 13)$$

and the inter-field distortion array satisfying Eq 8–10 and Eq 4–7 is:

$$dxG(i,j)=dxGm(i,j)+Tx-qg*yG(i,j) \quad (Eq\ 14)$$

$$dyG(i,j)=dyGm(i,j)+Tx+qg*xG(i,j) \quad (Eq\ 15)$$

$$Qg(i,j)=Qgm(i,j,)+qg \quad (Eq\ 16)$$

At this point, having uniquely determined the inter-field distortion array, we can calculate the reference wafer calibration file. At a minimum, the following four quantities (xG, yG, dx, dy) are recorded into the wafer calibration file for each feature in the reference array which is on regular pitch P/M and each wafer alignment mark:

(xG, yG)=nominal (x,y) position of feature on the wafer (interfield or grid coordinates with center of coordinate system at wafer center (x,y axes in FIG. 33)), (dx, dy)=offset or error in nominal position of feature on the wafer. The true position of the feature is given by:

$$(Xtrue, Ytrue)=(xG+dx, yG+dy)=\text{true position of feature on wafer} \quad (Eq\ 17)$$

The nominal positions (xG, yG) of all features on the wafer are known to us because they are the positions as they would be placed by a perfect projection imaging system using perfect reference reticles. These numbers are known since both the stepping pattern on the reference wafer is known as well as the design of the reference reticles.

The offset errors of a feature located at intra-field index (a,b) within exposure field (i,j) on the reference wafer the offset error (dx, dy) is calculated as:

$$dx(a,b;i,j)=dxG(i,j)-Qg(i,j)*xf(a)+dxf(a,b) \quad (Eq\ 18)$$

$$dy(a,b;i,j)=dyG(i,j)+Qg(i,j)*yf(b)+dyf(a,b) \quad (Eq\ 19)$$

All of the quantities on the right hand side of Eq. 18 and 19 are known and therefore (dx, dy) is directly determined. This suffices for the determination of the offset errors for the reference array on regular pitch P/M (FIG. 33).

For wafer alignment marks, WM, that cover a more extended region or off grid portion of projection field (i,j) we would use the following formulas to determine the offset error:

$$dx(WM,i,j)=dxG(i,j)-Qg(i,j)*<xf>(WM)+<dxf>(WM) \quad (Eq\ 20)$$

$$dy(WM,i,j)=dxG(i,j)+Qg(ij)*<yf>(WM)+<dyf>(WM) \quad (Eq\ 21)$$

where:

(<xf~>,<yf>)(WM)=(x,y) center of mass or average position of WM in intra-field coordinates, and (<dxf>,<dyf>)(WM)=average intra-field distortion of WM. This is calculated by interpolating the given values for intra-field distortion, (dxf, dyf)(a,b), so that they apply everywhere in the field and then calculating the area weighted offset of all of the components making WM. Having computed all of the nominal positions and offsets we create a file (FIG. 34) detailing the feature, xG, yG, dx, dy, and possibly other information. This file is uniquely associated with a particular reference wafer (FIG. 33).

Final Articles

The final articles that result from the process of FIG. 6 is a completed reference wafer (FIG. 33) and corresponding calibration file (FIG. 34). Because the reference wafer of FIG. 33 has a wafer scale (covering the entire wafer, not limited to a single exposure field) reference array (pitch=P/M) that is uninterrupted by field boundaries, and the position of each reference mark and wafer alignment mark is accurately known from the calibration file and Eq 17, the article can be used to perform stepper and scanner matching without any regard to field size or format. See System and Method for Optimizing the Grid and Intrafield Registration of Wafer Patterns, supra; Mix-and-Match: A Necessary Choice, supra; Expanding Capabilities in Existing Fabs with Lithography Tool-Matching, supra. Thus, the interlocking rows and columns of the reference wafer that were vital to the accurate determination of position, though they physically remain, are not a concern and do not interfere with users of the reference wafer; all that is required is the reference wafer and its' calibration file.

Alternate Embodiment

Figure 14:
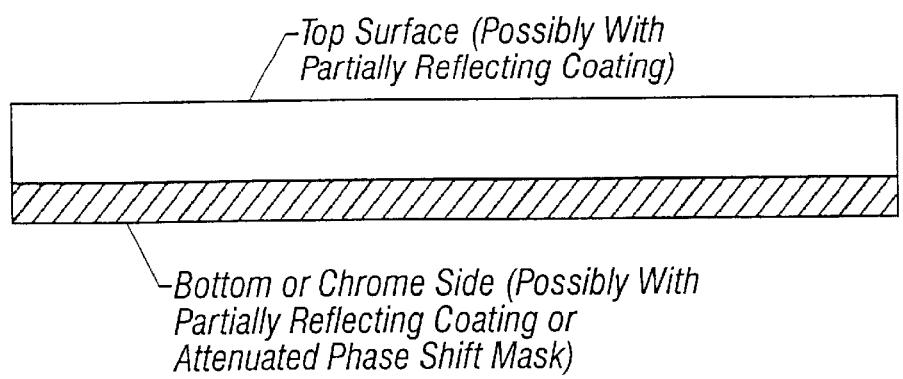
FIG. 14 is a side view of a reference reticle.

Similar process steps as described above are used except for being adapted to step and scan tools (scanners) (See Optical Lithography—Thirty Years and Three Orders of Magnitude, supra) by exposing the wafer alignment marks and the interlocking reference arrays with multiple sub-Eo exposures, and also providing a reticle with reduced transmission. Eo (E-zero) is the minimum exposure dose required for a large (>200 micron at wafer) open area pattern on the reticle to become fully developed or cleared (in the case of positive resist). Eo depends on the particular resist and resist development process. The intra-field error of scanners has an intrinsic non-repeatable component (0.7 NA DUV Step and Scan System for 150nm Imaging with Improved Overlay, supra) whose effect on the manufactured reference wafers is desired to minimize. Reference reticles, similar to the reticles shown in FIGS. 13A and 13B, may be provided with a partially reflecting dielectric coating either on their non-chrome or possibly chrome coated (machine optical object plane) surface as shown in FIG. 14. For example, a 95% reflecting dielectric coating applied to the reference reticles means that if twenty exposure sequences at a dose of 2*Eo each are performed the net effect is to expose the wafer with a dose of 2*Eo and to have effectively averaged over as many as twenty exposures. An advantage of this technique is that it averages out the non-repeatable part of the scanner error. Thus, if the reference wafer requires a dose of b*Eo, and we expose at a dose of a*Eo, the overlay reticle has a coating that reflects a fraction R of light incident on it, then the number of exposures (N) required to get a dose of b*Eo on the reference wafer is:

$$N=1+\text{floor}(b/(a*(1-R)))  \quad \text{(Eq 22)}$$

and floor(x)=integer part of the real number x.

As a typical example, exposing at a dose of 1*Eo (a=1), using reference reticles that are 90% reflecting (R=0.90) and requiring a dose on the reference wafers of 2*Eo (b=2) means the number of required exposures is (Eq 22) N=21 resulting in effectively averaging over as many as twenty-one realizations of the intra-field distortion. While this embodiment has been described with respect to a partially reflecting reticle, there are similar considerations if the overlay reticle is absorbing or attenuated. An attenuated phase shift mask is well suited for this purpose (See The Attenuated Phase Shift Mask, B. Lin, Solid State Technology, Special Series/Advanced Lithography, 35(1):43–47, 1992) instead of reflecting; all that is required is a reticle with a decreased optical transmission from normal. In general, the reticle typically needs an optical transmission (1-R for a reflective mechanism) of <50% of normal or nominal.

Reference Reticle Fabrication

The reticle plate, as shown in FIGS. 13A, 13B and 14, makes no requirements on the size of the reticle plate, the design of the overlay targets or alignment attributes or the types of materials used to fabricate it. In cases where it might be necessary to have more wafer alignment marks a third or multiple reference reticles might be appropriate. Alternatively, both the interlocking array with reference marks and the wafer alignment marks could be contained on one and the same reticle. This is especially practical if the reference wafers are to be manufactured on a scanner using the scanner's static field, then there is certainly room on a single reticle for both. Heretofore, we have considered the reticle creating the patterns as perfect. In practice it is, not but errors in the reticle manufacture can be taken into account by first measuring the position of all the individual structures on the reference reticle using an absolute metrology tool such as the Nikon 51 (See Measuring System XY-5I, supra), or Leica IPRO series tools. See Leica LMS IPRO Brochure, supra. Next, in formulating Equations 4–7, this reticle error (divided by the projection imaging tool demagnification (M)) is explicitly written out on the right hand side and then subtracted from the resulting overlay measurements on the left hand side of the equations (thereby canceling out on the right hand side). The result is Equations 4–7 as they are written above but with a correction applied to the overlay measurements appearing on the left hand side. This accounts for the reticle error in the determination of the inter field grid and yaw distortion (dxG, dyG, Qg). The other correction for reticle distortion is directly added to the dx or dy term of Equations 18–21 as the reference reticle error at the feature we are considering divided by M.

Additional Embodiments

Thus far, embodiments have been mainly described with respect to alignment attributes that are in the form of a box in box or frame in frame pattern as shown in FIG. 11A. Other alignment attributes such as gratings (See Overlay Alignment Measurement of Wafers, supra [FIG. 1b], wafer alignment marks (See Matching Management of Multiple Wafer Steppers Using a Stable standard and a Matching Simulator, supra), van der Pauw resistors (See Automated Electrical Measurements of Registration Errors in Step and Repeat Optical Lithography Systems, supra), vernier pairs (See Method of Measuring Bias and Edge Overlay Error for Sub 0.5 Micron Ground Rules, supra), or capacitor structures (See Capacitor Circuit Structure for Determining Overlay Error, supra) could be used instead. In general, any alignment attribute that can be used by an overlay metrology tool for measuring offsets can be utilized.

The overlay metrology tool utilized is typically a conventional optical overlay tool such as those manufactured by KLA-Tencor (See KLA 5105 Overlay Brochure, supra; KLA 5200 Overlay Brochure, supra) or Bio-Rad Semiconductor Systems. See Quaestor Q7 Brochures, supra. Other optical overlay tools can also be used. See Process for Measuring Overlay Misregistration During Semiconductor Wafer Fabrication, supra or See Overlay Alignment Measurement of Wafers, supra. In addition, some steppers or scanners can utilize their wafer alignment systems and wafer stages to function as overlay tools (See Matching Management of Multiple Wafer Steppers Using a Stable standard and a Matching Simulator, supra). In general, the total size of the alignment attribute is limited (in this case consisting of two wafer alignment marks) to a distance over which the wafer stage would be as accurate as a conventional optical overlay tool. This distance is typically <0.5 mm. When electrical alignment attributes are used for overlay (See Electrical Methods for Precision Stepper Column Optimization, L. Zych et al., SPIE Vol. 633, 98:105, 1986; Automated Electrical Measurements of Registration Errors in Step and Repeat Optical Lithography Systems, supra, Capacitor Circuit Structure for Determining Overlay Error, supra), the overlay metrology tool would correspond to the electrical equipment utilized for making the corresponding measurement.

Thus far, the description has been with respect to manufacture and use of a reference wafer on the projection imaging tools (steppers (See Direct-Referencing Automatic Two-Points Reticle-to-Wafer Alignment Using a Projection Column Servo System, supra; New 0.54 Aperture I-Line Wafer Stepper with Field by Field Leveling Combined with Global Alignment, supra; Projection Optical System for Use in Precise Copy, T. Sato et al., U.S. Pat. No. 4,861,148 issued Aug. 29, 1989), and scanners (See Micrascan™ III Performance of a Third Generation, Catadioptric Step and Scan Lithographic Tool, supra; Step and Scan Exposure System for 0.15 Micron and 0.13 Micron Technology Node, supra; 0.7 NA DUV Step and Scan System for 150 nm Imaging with Improved Overlay, supra) most commonly used in semiconductor manufacturing today. However, the articles described can be manufactured or applied to other projection imaging tools such as contact or proximity printers (See Optical Lithography—Thirty Years and Three Orders of Magnitude, supra), 2-dimensional scanners (See Large Area Fine Line Patterning by Scanning Projection Lithography, supra; Large-Area, High-Throughput, High-Resolution Projection Imaging System, supra; Optical Lithography—Thirty Years and Three Orders of Magnitude, supra), office copy machines, and next generation lithography (ng1) systems such as XUV (See Development of XUV Projection Lithography at 60–80 nm, supra), SCALPEL, EUV (Extreme Ultra Violet) (See Reduction Imaging at 14 nm Using Multilayer-Coated Optics: Printing of Features Smaller than 0.1 Micron, J. Bjorkholm et al., Journal Vacuum Science and Technology, B 8(6), 1509:1513, November/December 1990), IPL (Ion Projection Lithography), and EPL (electron projection lithography). See Mix-and-Match: A Necessary Choice, supra.

The above description utilized only a single projected wafer alignment mark. However, multiple types of wafer alignment marks, one for each type of tool in the fab we will be analyzing or different angular orientations, See FIG. 33, could be projected to increase the utility of the reference wafer. In the case of multiple wafer alignment marks, the procedure would be modified so that the resulting calibration file would contain the nominal and offset position of all of the projected alignment marks.

Figure 36:
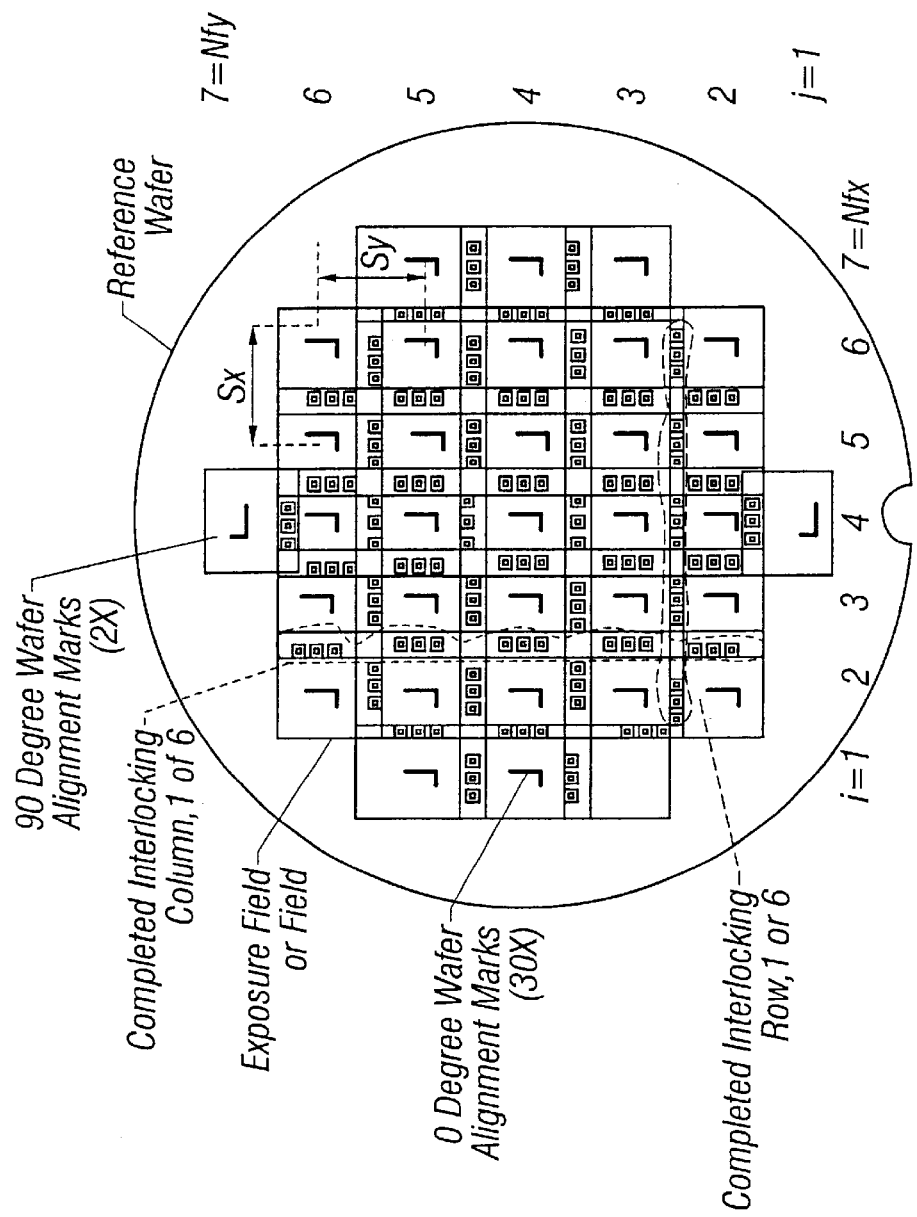
FIG. 36 is a schematic showing a reference wafer containing wafer alignment marks only.

While the above describes laying down a series of reference marks on a regular, wafer scale array of pitch P/M, any other pattern that is built up by interlocking fields along rows and columns can also be used. The positions of the resulting features can be measured and recorded in a calibration file that is determined as described above. In particular, a wafer could be created that consisted entirely of wafer alignment marks at precisely known positions as illustrated in FIG. 36. Such a reference wafer and its associated calibration file is valuable for assessing projection imaging tool alignment system performance.

The reference reticle is typically glass with openings defined in a chrome coating. This is common for projection lithography tools utilized in semiconductor manufacture. The form the reticle can take will be determined by the format required by the specific projection imaging tool on which the reticle is loaded. Thus, an extreme ultra-violet (XUV) projection system would typically have a reflective reticle. See Development of XUV Projection Lithography at 60–80 nm, supra.

The embodiments described above have been mainly described with respect to the recording medium being positive photoresist. Negative photoresist could equally well be used provided that appropriate adjustment to the box in box structures on the reticle are made. Other types of recording medium can also be used, for example, an electronic CCD, a diode array, liquid crystal, or other optically sensitive material. In general, the recording medium is whatever is typically used on the projection imaging tool used for manufacturing the reference wafers. Thus, on an EPL tool, an electron beam resist such as PMMA could be utilized as the recording medium.

So far, the substrates on which the recording media is placed have been described as wafers. This will typically be the case in semiconductor manufacture. The exact form of the substrate will be dictate by the projection imaging tool used for its manufacture and its use in a specific manufacturing environment. Thus, in a flat panel manufacturing facility, the reference substrate would be a glass plate or panel. Circuit boards or multi-chip module carriers are other possible substrates.

Figure 7:
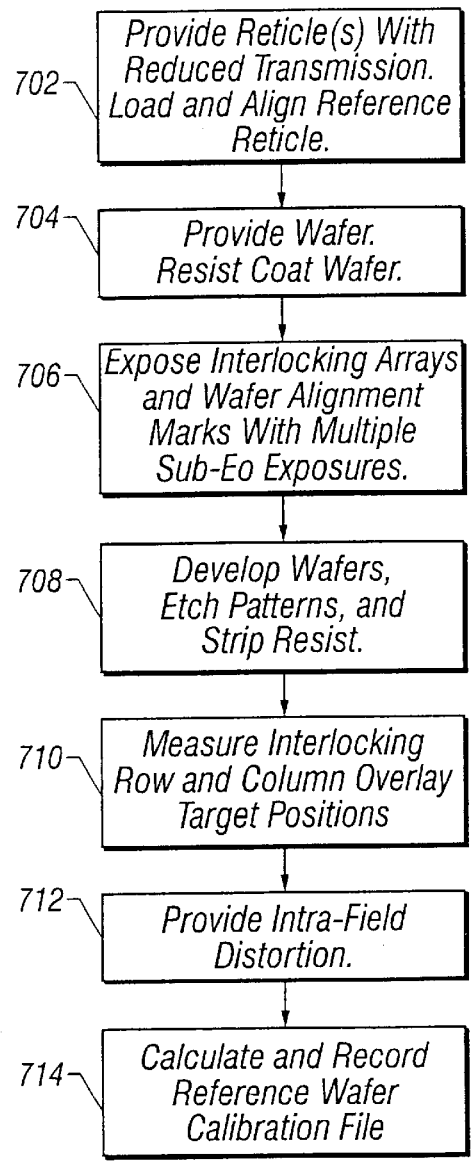
FIG. 7 is a flow chart of another embodiment for creating reference wafers.

FIG. 7 is a flow chart illustrating another embodiment for creating a reference wafer. In block 702 a reference reticle with reduced transmission is loaded into an exposure tools' reticle management system. Flow continues to block 704 where the wafer is then coated with photoresist and loaded into a projection imaging tool or machine. In block 706 the wafer is exposed, in an overlapping interlocking pattern, with multiple sub-$E_0$ exposures.

Flow then continues to block 708 where, after the final exposure the wafer is removed from the machine and sent through the final few resist development steps. Next, the wafers are etched and stripped of photoresist and possibly overcoated with another layer. This leaves the alignment attributes and wafer alignment marks permanently recorded on the wafer surfaces. Flow then continues to block 710 where the resulting alignment attributes along the interlocking rows and columns are measured for registration, placement or overlay error.

Next, in block 712, the intra-field distortion of the projection imaging tool used to create the reference wafer is provided. Flow continues to block 714 when the resulting data set is entered into a computer algorithm where a special calibration file containing the positional coordinates for each alignment attribute is constructed for the reference wafer.

Figure 8:
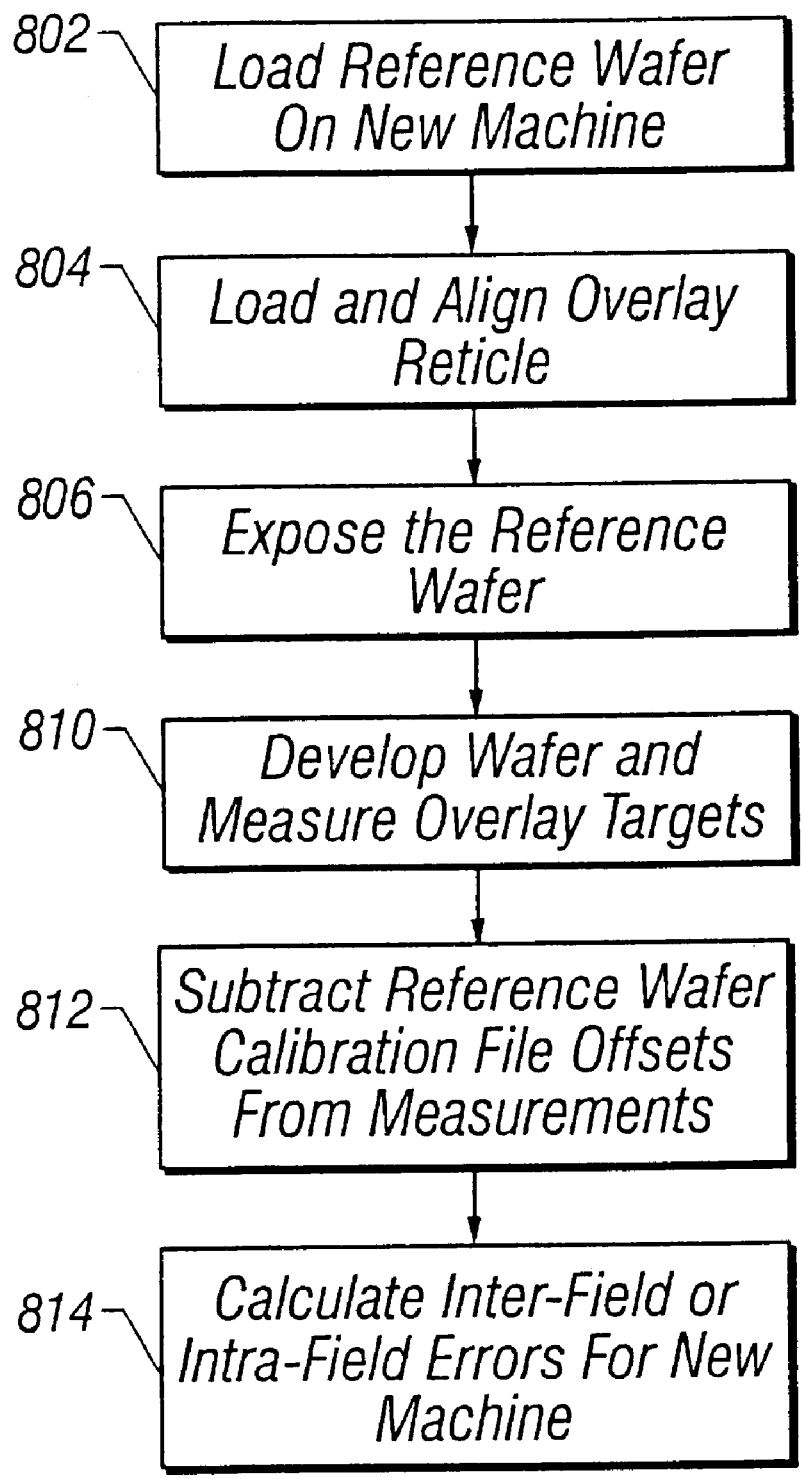
FIG. 8 is a flow chart illustrating an application of the reference wafer.
Figure 9:
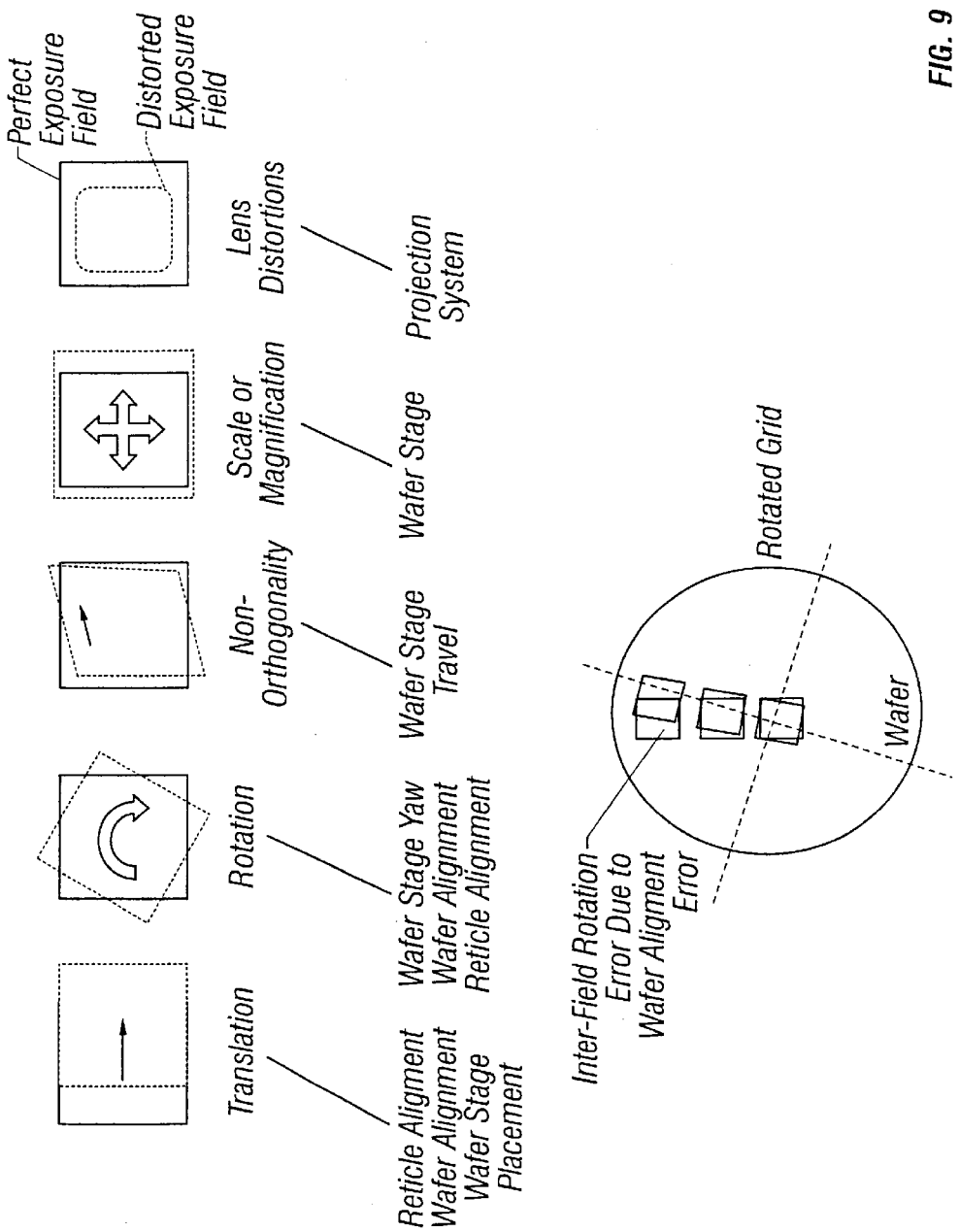
FIG. 9 is a block diagram illustrating common causes of overlay or placement error.
Figure 10:
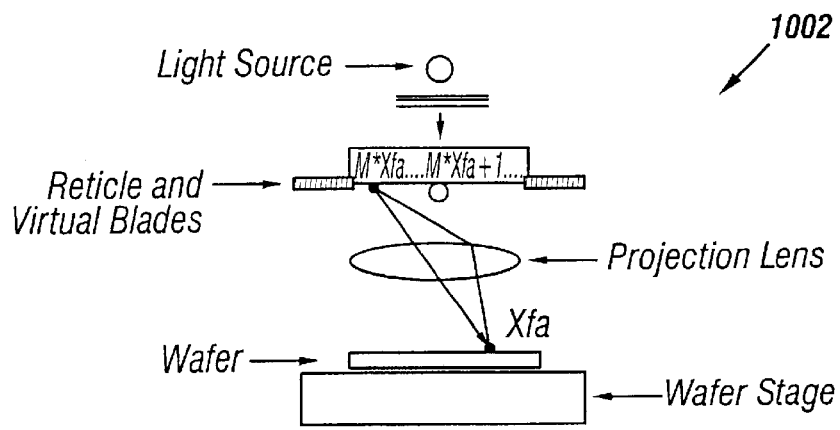
FIG. 10 is a block diagram showing a photolithographic stepper or scanner system.

FIG. 8 is a flow diagram of an example of an application of the reference wafer. Flow begins in block 802 and the reference wafer is loaded onto a machine. Flow continues to block 804 where an overlay reticle is loaded and aligned on the machine. Then in block 806 the reference wafer is exposed. In block 810 the wafer is developed and the overlay targets are measured. In block 812 the references wafer calibration file offsets are subtracted from the measurements. Then, in block 814 the inter-field or intra-field errors for the new machine are calculated.

The machine on which the reference wafer is loaded may be different types of imaging tools. For example, the machine may be a stepper projection imaging tool, a scanner projection imaging tool, an electron beam imaging system, an electron beam direct write system, a SCAPEL tool, an extreme ultra-violet imaging apparatus, an ion projection lithography tool, or an x-ray imaging system. Also, the subtraction of the calibration file and the calculation of the inter-field or intra-field errors may be performed on a computer or a controller. In addition, the calibration file may be stored on a computer readable medium, for example, a tape, a diskette, or a CD.

The foregoing description details certain embodiments of the invention. It will be appreciated, however, that no matter how detailed the foregoing appears, the invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes which come with the meaning and range of equivalency of the claims are to be embraced within their scope.

We claim:

1. A method of manufacturing a reference substrate on a projection imaging tool, the method comprising:

providing at least one reticle, the at least one reticle including interlocking rows and columns of alignment attributes;

exposing the at least one reticle onto a substrate that includes a recording media, in a pattern such that adjacent exposures create a pattern of interlocking alignment attributes;

developing the recording media;

etching the exposed substrate;

stripping the substrate of the recording media;

providing an intra-field error of the projection imaging tool;

measuring overlay errors of desired alignment attributes and calculating the positional coordinates of the desired alignment attributes with respect to the intra-field error and overlay errors, and creating a calibration file associated with the reference substrate that records the positional coordinates of the alignment attributes.

2. A method as defined in claim 1, wherein measuring the overlay errors further comprises using an overlay metrology tool.

3. A method as defined in claim 1, wherein the substrate is a semiconductor silicon wafer.

4. A method as defined in claim 1, wherein the substrate is a semiconductor quarts wafer.

5. A method as defined in claim 1, wherein the substrate is a flat panel display.

6. A method as defined in claim 1, wherein the substrate is a reticle.

7. A method as defined in claim 1, wherein the substrate is a photo-mask.

8. A method as defined in claim 1, wherein the substrate is a mask plate.

9. A method as defined in claim 1, wherein measuring the overlay errors includes using an optical overlay metrology tool.

10. A method as defined in claim 1, wherein the recording media is a positive resist material.

11. A method as defined in claim 1, wherein the recording media is a negative resist material.

12. A method as defined in claim 1, wherein the recording media is an electronic CCD.

13. A method as defined in claim 1, wherein the recording media is a diode array.

14. A method as defined in claim 1, wherein the recording media is a liquid crystal.

15. A method as defined in claim 1, wherein the recording media is an optically sensitive material.

16. A method as defined in claim 1, wherein the at least one reticle is chrome patterned glass.

17. A method as defined in claim 16, further including a reflective dielectric coating.

18. A method as defined in claim 1, wherein the at least one reticle is an attenuated phase shift mask.

19. A method as defined in claim 1, wherein the at least one reticle is reflective.

20. A method as defined in claim 1, wherein the alignment attributes include a box-in-box pattern.

21. A method as defined in claim 1, wherein the alignment attributes include a frame-in-frame pattern.

22. A method as defined in claim 1, wherein the alignment attributes include a vernier pattern.

23. A method as defined in claim 1, wherein the alignment attributes include a segmented bar-in-bar pattern.

24. A method as defined in claim 1, wherein the alignment attributes include a grating.

25. A method as defined in claim 1, wherein the at least one reticle is a single reticle.

26. A method as defined in claim 1, wherein the at least one reticle includes multiple reticles wherein a first reticle includes a first type of alignment attributes and a second reticle includes a second type of alignment attributes.

27. A method as defined in claim 26, wherein a plurality of the second type of reticles are used.

* * * * *

UNITED STATES PATENT AND TRADEMARK OFFICE
CERTIFICATE OF CORRECTION

PATENT NO. : 6,699,627 B2
DATED : March 2, 2004
INVENTOR(S) : Adlai Smith et al.

It is certified that error appears in the above-identified patent and that said Letters Patent is hereby corrected as shown below:

Column 14,
Line 33, please delete "ts" and insert -- its --;

Column 15,
Line 38, please delete "(dxf, d)" and insert -- (dxf,dyf) --.

Signed and Sealed this

Twenty-second Day of June, 2004

JON W. DUDAS
*Acting Director of the United States Patent and Trademark Office*